(12) United States Patent
Tong et al.

(10) Patent No.: US 12,366,779 B2
(45) Date of Patent: Jul. 22, 2025

(54) DISPLAY PANEL COMPRISING A BLOCKING STRUCTURE AND A SPACER AND DISPLAY APPARATUS

(71) Applicants: Beijing BOE Technology Development Co., Ltd., Beijing (CN); BOE Technology Group Co., Ltd., Beijing (CN)

(72) Inventors: Jie Tong, Beijing (CN); Yanqing Chen, Beijing (CN); Jian Sun, Beijing (CN); Jianyun Xie, Beijing (CN); Haoyi Xin, Beijing (CN); Xuelu Wang, Beijing (CN); Wenhong Tian, Beijing (CN)

(73) Assignees: Beijing BOE Technology Development Co., Ltd., Beijing (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/776,322

(22) Filed: Jul. 18, 2024

(65) Prior Publication Data
US 2025/0044653 A1 Feb. 6, 2025

Related U.S. Application Data

(63) Continuation of application No. PCT/CN2023/110624, filed on Aug. 1, 2023.

(51) Int. Cl.
*G02F 1/1362* (2006.01)
*G02F 1/1335* (2006.01)
(Continued)

(52) U.S. Cl.
CPC ..... *G02F 1/136209* (2013.01); *H10D 86/441* (2025.01); *H10D 86/60* (2025.01); *G02F 1/133514* (2013.01)

(58) Field of Classification Search
None
See application file for complete search history.

(56) References Cited

U.S. PATENT DOCUMENTS

2017/0192564 A1* 7/2017 Li ........................ G06F 3/0446
2017/0293172 A1* 10/2017 Zhang ............... G02F 1/136209

FOREIGN PATENT DOCUMENTS

CN 103513478 A * 1/2014 ....... G02F 1/133512
CN 106773249 A 5/2017
(Continued)

*Primary Examiner* — Paul C Lee
(74) *Attorney, Agent, or Firm* — IPro, PLLC

(57) ABSTRACT

The present disclosure provides a display panel and a display apparatus. The display panel includes: a base substrate; pixel light-transmitting regions, each pixel light-transmitting regions includes: pixel light-transmitting region rows extending in a first direction and arranged in a second direction; at least one of the pixel light-transmitting region rows includes: a first pixel light-transmitting region, a second pixel light-transmitting region, and a third pixel light-transmitting region; a length of the third pixel light-transmitting region is less than that of the first pixel light-transmitting region in the second direction, and is less than that of the second pixel light-transmitting region in the second direction; and a first blocking structure on one side of the base substrate, an orthographic projection of the first blocking structure is in a gap between orthographic projections of two at least partially adjacent third pixel light-transmitting regions in the second direction on the base substrate.

19 Claims, 17 Drawing Sheets

(51) Int. Cl.
*H10D 86/40* (2025.01)
*H10D 86/60* (2025.01)

(56) References Cited

FOREIGN PATENT DOCUMENTS

| | | | |
|---|---|---|---|
| CN | 110300917 A | | 10/2019 |
| CN | 114236928 A | * | 3/2022 |
| CN | 114236932 A | | 3/2022 |
| JP | 2010097025 A | | 4/2010 |

* cited by examiner

DISPLAY PANEL COMPRISING A BLOCKING STRUCTURE AND A SPACER AND DISPLAY APPARATUS

CROSS-REFERENCE TO RELATED APPLICATIONS

This application is a continuation of International Application No. PCT/CN2023/110624, filed Aug. 1, 2023, which is hereby incorporated by reference in its entirety.

TECHNICAL FIELD

The present disclosure relates to the field of semiconductor technology, and in particular to a display panel and a display apparatus.

BACKGROUND

Due to the head-mounted display product using the virtual reality (VR) technology belongs to the near-eye display and the image displayed by the liquid crystal display screen display need to be magnified multiple times by the imaging system to enter the human eyes, even if the current VR display resolution has been done more than 1000 PPI, the screen door effect caused by the shielding structure in the display of the entire machine is still visible, which is as shown in FIG. 1 and affects the viewing experience.

SUMMARY

Embodiments of the present disclosure provide a display panel and a display apparatus. The display panel includes:
a base substrate;
a plurality of pixel light-transmitting regions, wherein the plurality of pixel light-transmitting regions includes: a plurality of pixel light-transmitting region rows extending in a first direction and arranged in a second direction; at least one pixel light-transmitting region row of the plurality of pixel light-transmitting region rows includes: a first pixel light-transmitting region, a second pixel light-transmitting region, and a third pixel light-transmitting region; a length of the third pixel light-transmitting region in the second direction is less than a length of the first pixel light-transmitting region in the second direction, and is less than a length of the second pixel light-transmitting region in the second direction; and
a first blocking structure on one side of the base substrate, wherein an orthographic projection of the first blocking structure on the base substrate is in a gap between orthographic projections of two third pixel light-transmitting regions in the second direction that are at least partially adjacent to each other on the base substrate.

In a possible implementation, the length of the first pixel light-transmitting region in the second direction is equal to the length of the second pixel light-transmitting region in the second direction; and a waveband range of light emitted from the third pixel light-transmitting region is narrower than a waveband range of light emitted from the first pixel light-transmitting region and is narrower than a waveband range of light emitted from the second pixel light-transmitting region.

In a possible implementation, the display panel further includes: a spacer;
an orthographic projection of the spacer on the base substrate is in a gap between orthographic projections of two third pixel light-transmitting regions that are partially adjacent to each other on the base substrate, and the orthographic projection of the spacer on the base substrate does not overlap with the orthographic projection of the first blocking structure on the base substrate.

In a possible implementation, the first blocking structure and the spacer are alternately distributed in the second direction.

In a possible implementation, the display panel further includes: a second blocking structure; wherein an orthographic projection of the second blocking structure on the base substrate covers the orthographic projection of the spacer on the base substrate;
a maximum length of the first blocking structure in the second direction is less than a maximum length of the second blocking structure in the second direction.

In a possible implementation, in the pixel light-transmitting region row, the first pixel light-transmitting region, the second pixel light-transmitting region, and the third pixel light-transmitting region arranged sequentially along the first direction; and pixel light-transmitting regions, light emitted from which is of the same waveband range, are in the same one second direction;
the first pixel light-transmitting region is provided with a first missing portion on one side of the first pixel light-transmitting region facing the second blocking structure; and the second pixel light-transmitting region is provided with a second missing portion on one side of the second pixel light-transmitting region facing the second blocking structure.

In a possible implementation, a ratio of the maximum length of the first blocking structure in the second direction to the maximum length of the second blocking structure in the second direction is greater than or equal to 0.78.

In a possible implementation, a ratio of an area of the third pixel light-transmitting region to an area of the first pixel light-transmitting region is greater than 50%; and a ratio of the area of the third pixel light-transmitting region to an area of the second pixel light-transmitting region is greater than 50%.

In a possible implementation, the orthographic projection of the first blocking structure on the base substrate is a rectangle; and the orthographic projection of the second blocking structure on the base substrate is a hexagon, octagon, circle, or ellipse.

In a possible implementation, the display panel further includes: a third blocking structure, wherein an orthographic projection of the third blocking structure on the base substrate is in a gap between two pixel light-transmitting region rows that are adjacent to each other; and
a length of the first blocking structure in the second direction is greater than a length of the third blocking structure in the second direction.

In a possible implementation, the first blocking structure, the second blocking structure, and the third blocking structure satisfy a following relational equation:

$$2(a1 + b3) = 2a3 + b1 + b2;$$

a1 represents a maximum length of the first pixel light-transmitting region in the second direction, a2 represents a maximum length of the second pixel light-transmitting region in the second direction, a3 represents a maximum length of the third pixel light-transmitting region in the second direction, b1 represents a maximum length of the first blocking structure in the second direction Y, b2 represents a maximum length of the second blocking structure in the second direction and b3 represents a maximum length of the third blocking structure in the second direction.

In a possible implementation, a plurality of third pixel light-transmitting regions in the pixel light-transmitting region row include: a plurality of first class of third pixel light-transmitting regions, and a plurality of second class of third pixel light-transmitting regions; wherein an orthographic projection of the first class of third pixel light-transmitting region on the base substrate is adjacent to an orthographic projection of the second blocking structure, that is between the first class of third pixel light-transmitting region and an adjacent pixel light-transmitting region row, on the base substrate, and an orthographic projection of the second class of third pixel light-transmitting region on the base substrate is adjacent to an orthographic projection of the first blocking structure, that is between the second class of third pixel light-transmitting region and the adjacent pixel light-transmitting region row, on the base substrate.

In a possible implementation, the second blocking structure satisfies a following relational equation:

$$x1 + y1 = b2;$$

b2 represents the maximum length of the second blocking structure in the second direction, x1 represents a distance between a first outer edge and a second outer edge in the second direction, the first outer edge is an outer edge of the first class of third pixel light-transmitting region of the m-th pixel light-transmitting region row facing the (m−1)-th pixel light-transmitting region row and extending in the first direction, the second outer edge is an outer edge of the first pixel light-transmitting region of the m-th pixel light-transmitting region row facing the (m−1)-th pixel light-transmitting region row and extending in the first direction, y1 represents a distance between a third outer edge and a fourth outer edge in the second direction, and the third outer edge is an outer edge of the second class of third pixel light-transmitting region in the (m+1)-th pixel light-transmitting region row, facing the (m+2)-th pixel light-transmitting region row and extending in the first direction, and the fourth outer edge is an outer edge of the first pixel light-transmitting region of the (m+2)-th pixel light-transmitting region row facing the (m+1)-th pixel light-transmitting region row and extending in the first direction.

In a possible implementation, the third blocking structure satisfies a following relational equation:

$$X2 + y2 = b1$$

b1 represents the maximum length of the first blocking structure in the second direction, x2 represents a difference between a fifth outer edge and the second outer edge in the second direction, the fifth outer edge is an outer edge of the second class of third pixel light-transmitting region in the m-th pixel light-transmitting region row facing the (m−1)-th pixel light-transmitting region row and extending in the first direction, y2 represents a difference between a sixth outer edge and the fourth outer edge in the second direction, and the sixth outer edge is an outer edge of the first class of third pixel light-transmitting region in the (m+1)-th pixel light-transmitting region row facing the (m+2)-th the pixel light-transmitting region row and extending in the first direction.

In a possible implementation, the second blocking structure satisfies a following relational equation:

$$y1 - b3 = x1;$$

y2−b3=x2; b3 represents the maximum length of the third blocking structure in the second direction.

In a possible implementation, the third pixel light-transmitting region satisfies a following relationship equation:

$$X1 = 2*x2.$$

In a possible implementation, the display panel further includes: a fourth blocking structure, and a fifth blocking structure; wherein the fourth blocking structure extends in the first direction and an orthographic projection of the fourth blocking structure on the base substrate is in a gap between two pixel light-transmitting region rows that are adjacent to each other, and the fifth blocking structure extends in the second direction and an orthographic projection of the fifth blocking structure on the base substrate is in a gap between two pixel light-transmitting regions that are adjacent to each other; and;
the orthographic projection of the third blocking structure on the base substrate covers the orthographic projection of the fourth blocking structure on the base substrate.

In a possible implementation, the display panel includes: an array substrate and an opposing substrate opposite to each other;
the array substrate includes: the base substrate, a first light-shielding metal layer on one side of the base substrate, a second light-shielding metal layer on one side of the first light-shielding metal layer away from the base substrate; and
the opposing substrate includes: a black matrix.

In a possible implementation, at least one of the first blocking structure, the second blocking structure, the third blocking structure, the fourth blocking structure, or the fifth blocking structure is in the same one layer with
the first light-shielding metal layer,
the second light-shielding metal layer, or
the black matrix.

In a possible implementation, the third blocking structure is in the array substrate.

In a possible implementation, the display panel further includes: a color film layer; wherein the color film layer is in the opposing substrate, or, the color film layer is in the array substrate.

Embodiments of the present disclosure also provide a display apparatus, including the display panel provided by the embodiments of the present disclosure.

DETAILED DESCRIPTION

Figure 1:
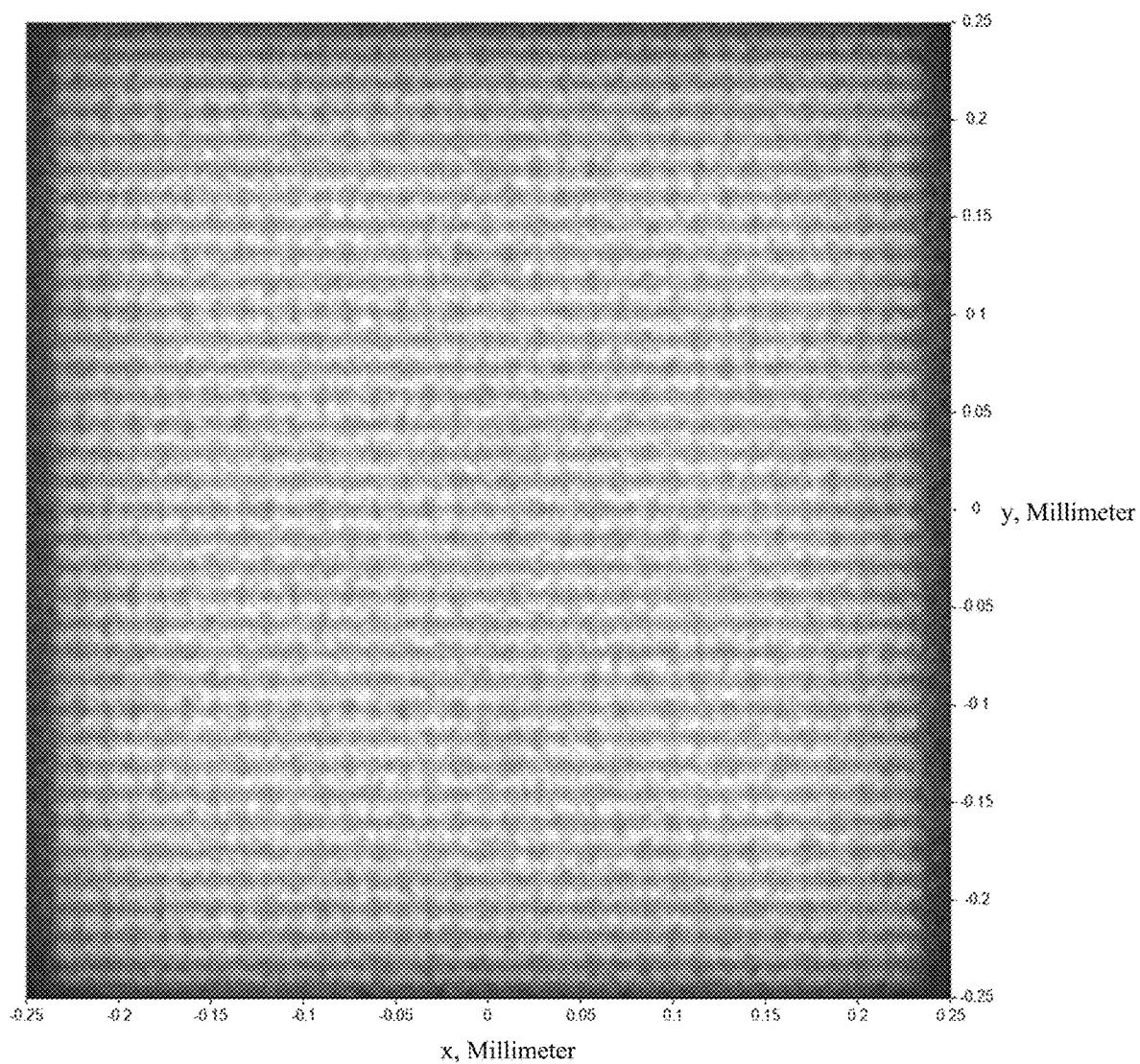
FIG. 1 is a schematic diagram of a screen door effect.

In order to make the objects, technical solutions and advantages of the embodiments of the present disclosure clearer, the technical solutions of the embodiments of the present disclosure will be described clearly and completely in the following in conjunction with the accompanying drawings of the embodiments of the present disclosure. Obviously, the described embodiments are a part of the embodiments of the present disclosure and not all of the embodiments. Based on the described embodiments of the present disclosure, all other embodiments obtained by a person of ordinary skill in the art without the need for creative labor fall within the claimed scope of the present disclosure.

Unless otherwise defined, technical or scientific terms used in the present disclosure shall have the ordinary meaning understood by a person of ordinary skill in the field to which the present disclosure belongs. The terms "first", "second", and the like as used in the present disclosure do not indicate any order, number, or significance, but are only used to distinguish different components. The words "including" or "comprising" and the like are intended to mean that the component or object preceded by the word encompasses the component or object listed after the word and its equivalents, and does not exclude other components or objects. Words such as "connected" or "coupled" are not limited to physical or mechanical connections, but may include electrical connections, whether direct or indirect. The words "up", "down", "left", "right", etc., are used only to indicate relative positional relationships. When the absolute position of the object being described changes, the relative positional relationship may also change accordingly.

As used herein, "about" or "substantially the same" includes the stated value and means within an acceptable range of deviation from the specific value as determined by a person of ordinary skill in the art taking into account the measurements discussed and the errors associated with the measurement of the specific quantity (i.e., the limitations of the measurement system). For example, "substantially the same" may mean that the difference relative to the stated value is within one or more standard deviations, or within ±30%, 20%, 10%, 5%.

In the accompanying drawings, the thicknesses of layers, films, panels, regions, and the like are enlarged for clarity. Exemplary embodiments are described herein with reference to a cross-sectional view as a schematic diagram of an idealized implementation. In this way, deviations from the shape of the drawing as a result of, for example, manufacturing techniques and/or tolerances will be expected. Thus, the embodiments described herein should not be construed as being limited to the specific shape of a region as shown herein, but rather include deviations in shape caused by, e.g., manufacturing. For example, regions illustrated or described as flat may typically have rough and/or non-linear features. Furthermore, the sharp corners illustrated may be rounded. Thus, the regions shown in the figures are schematic in nature and their shapes are not intended to be the precise shapes of the illustrated regions and are not intended to limit the scope of the present claims.

One of the ways to reduce the screen door effect is to increase the resolution, but due to process technologies and material limitations, it is difficult to increase the resolution. Therefore, it is necessary to optimize the design of the shielding structure of the pixel to reduce the screen door effect.

Embodiments of the present disclosure provide a display panel, referring to FIG. 2A-FIG. 2E, FIG. 3, FIG. 4A-FIG. 4C, FIG. 5, FIG. 6, FIG. 7, and FIG. 8. The display panel includes:

a base substrate 11;

a plurality of pixel light-transmitting regions P, the plurality of pixel light-transmitting regions P includes: a plurality of pixel light-transmitting region rows H extending along a first direction X and arranged along a second direction Y; at least one pixel light-transmitting region row of the plurality of pixel light-transmitting region rows H includes: a first pixel light-transmitting region P1, a second pixel light-transmitting region P2, and a third pixel light-transmitting region P3; a length a3 of the third pixel light-transmitting region P3 in the second direction Y is less than a length a1 of the first pixel light-transmitting region P1 in the second direction Y, and is less than a length a2 of the second pixel light-transmitting region P2 in the second direction Y; and a first blocking structure Z1 on one side of the base substrate 11, wherein an orthographic projection of the first blocking structure Z1 on the base substrate 11 is in a gap between orthographic projections of two third pixel light-transmitting regions P3 in the second direction Y that are at least partially adjacent to each other on the base substrate 11.

In the embodiments of the present disclosure, the length a3 of the third pixel light-transmitting region P3 in the second direction Y is smaller than the length a1 of the first pixel light-transmitting region P1 in the second direction Y, and is smaller than the length a2 of the second pixel light-transmitting region P2 in the second direction Y. The first blocking structure Z1 is disposed in the gap between two third pixel light-transmitting regions P3 that are at least partially adjacent to each other, which can reduce the third pixel light-transmitting regions P3 in the brightness differences at different positions, so that the third pixel light-transmitting regions P3 are more uniformly distributed in the whole pixel region, thereby reducing the screen door effect and improving the visual effect.

Specifically, the pixel light-transmitting region P can be understood as an effective display region of the pixel, and may be a region in the pixel region that is not blocked by a blocking structure (e.g., the light-shielding layer, a gate line, a data line, a second blocking metal layer, a black matrix, etc.). Specifically, In a possible implementation, as shown in FIG. 2A, the black matrix layer 6 has a black matrix opening region 60, wherein the third blocking structure Z3, which extends horizontally and is filled with diagonal lines blocks a part of the black matrix opening region 60, and the pixel light-transmitting region P may be a region, i.e., as shown by the white region in FIG. 2A, within the black matrix opening region 60 that is not blocked by the third blocking structure Z3.

In a possible implementation, the length a1 of the first pixel light-transmitting region P1 in the second direction Y is equal to the length a2 of the second pixel light-transmitting region P2 in the second direction Y; and a waveband range of light emitted from the third pixel light-transmitting region P3 is narrower than a waveband range of light emitted from the first pixel light-transmitting region P1, as well as narrower than a waveband range of light emitted from the second pixel light-transmitting region P2. In the embodiments of the present disclosure, the first blocking structure Z1 is provided by setting the length a3 of the third pixel light-transmitting region P3 in the second direction Y shorter. Moreover, compared to the first pixel light-transmitting region P1 and the second pixel light-transmitting region P2, light emitted from which is of a larger waveband range, the brightness of the third pixel light-transmitting region P3, light emitted from which is of a smaller waveband range is lower, which can effectively reduce the sensitivity of human eyes to the first blocking structure, and can reduce the brightness difference between a position with the spacer 2 and a position without the spacer 2 between the third pixel light-transmitting regions P3, so as to make the brightness more uniformly distributed the whole pixel region, thereby reducing the screen door effect and improving the visual effect.

Figure 2A:
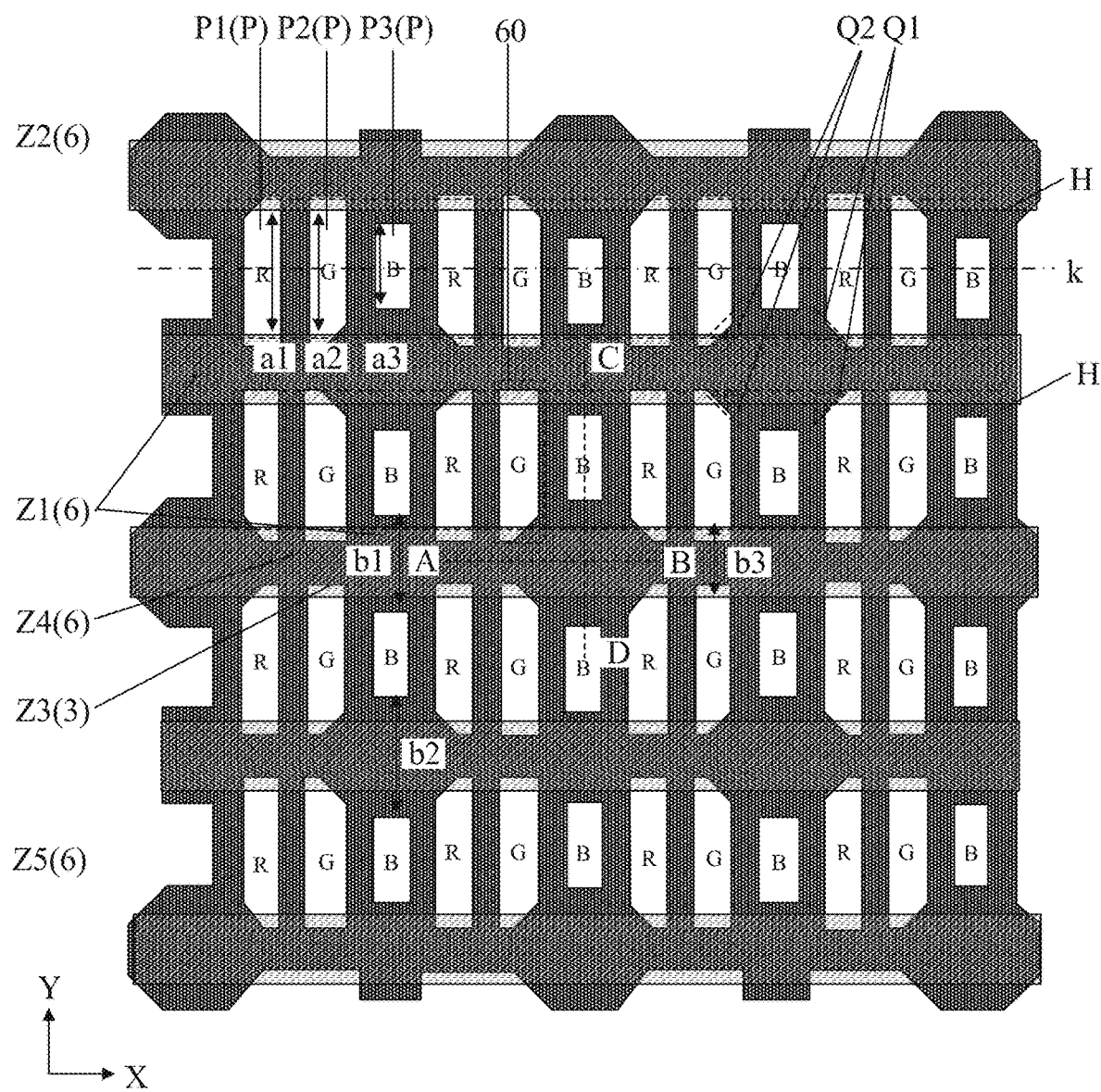
FIG. 2A is a first top view of a display panel provided by embodiments of the present disclosure.

In a possible implementation, referring to FIG. 2A-FIG. 2E, FIG. 4A-FIG. 4C, the display panel further includes: a spacer 2 (i.e., located in a region shown in the octagon in FIG. 2A). An orthographic projection of the spacer 2 on the base substrate 11 is located in the gap between the orthographic projections of two partially adjacent third pixel light-transmitting regions P3 in the second direction Y on the base substrate 11, and the orthographic projection of the spacer 2 on the base substrate 11 does not overlap with the orthographic projection of the first blocking structure Z1 on the base substrate 11. In the embodiments of the present disclosure, compared to the first pixel light-transmitting region P1 and the second pixel light-transmitting region P2, light emitted from which is of a larger waveband range, the brightness of the third pixel light-transmitting region P3, light emitted from which is of a smaller waveband range is lower, and thus the spacer 2 is placed in the gap between the adjacent third pixel light-transmitting regions P3, which results in a smaller visual difference between the brightness and darkness than that of placing the spacer 2 in the first pixel light-transmitting region P1 and the second pixel light-transmitting region P2, and can further effectively reduce the sensitivity of human eyes to the blocking object (e.g., the black matrix) at the position of the spacer 2, thereby reducing the screen door effect and improving the visual effect.

Figure 9:
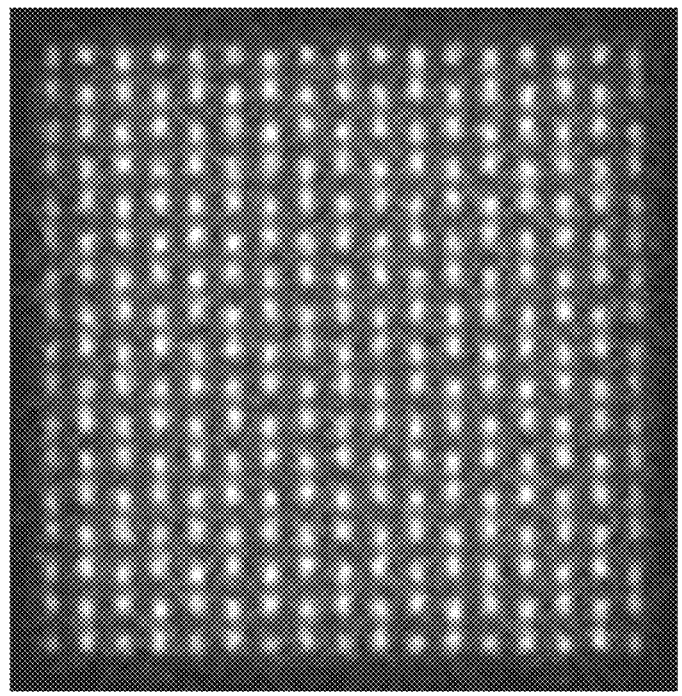
FIG. 9 is a simulation effect diagram of a first blocking structure Z1 in a gap between light-transmitting regions of red pixels that are adjacent to each other and $b1/b2=51.7\%$.
Figure 10:
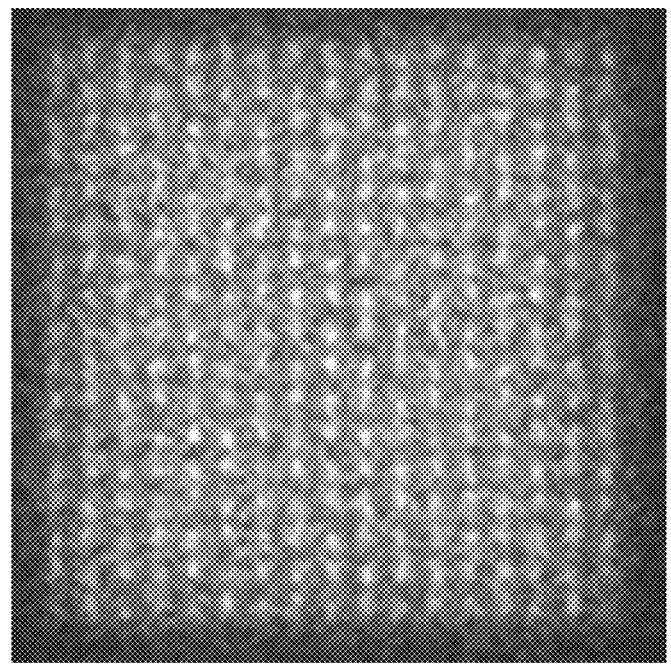
FIG. 10 is a simulation effect diagram of a first blocking structure Z1 in a gap between light-transmitting regions of blue pixels that are adjacent to each other and $b1/b2=51.7\%$.

Specifically, the third pixel light-transmitting region P3 may be a blue pixel light-transmitting region, the first pixel light-transmitting region P1 may be a red pixel light-transmitting region, and the second pixel light-transmitting region P2 may be a green pixel light-transmitting region. In the embodiments of the present disclosure, the spacer 2 may first be placed at a position in the gap between adjacent blue pixel light-transmitting regions, which effectively reduces the compensation sensitivity of the human eyes to the blocking object (e.g., the black matrix) at the position of the spacer 2 (blue pixels have lower brightness compared to green and red pixels, therefore, placing the spacer 2 in the gap between adjacent blue pixel light-transmitting regions causes a smaller visual difference between the brightness and darkness compared to placing it between green and red pixels, as shown in FIG. 9 and FIG. 10, FIG. 9 is a simulation effect diagram of placing the spacer 2 between adjacent red pixel light-transmitting regions, and FIG. 10 is a simulation effect diagram of placing the spacer 2 between adjacent blue pixel light-transmitting regions). In addition, the first blocking structure Z1 can be placed a position, between adjacent blue pixels, without the spacer 2, which reduces the brightness difference between a position of the blue pixel with the spacer 2 and a position of the blue pixel without the spacer 2, and make the brightness more uniformly distributed the whole pixel region, thereby reducing the screen door effect and improving the visual effect. As shown in FIG. 2G, if the first blocking structure Z1 is not added, in the pixel column, two immediately adjacent bright regions and one larger dark region alternately appears, thereby presenting a visual effect similar to that of a basing brick, as shown in FIG. 2F.

In a possible implementation, the waveband range of light emitted from the third pixel light-transmitting region P3 may also be wider than the waveband range of light emitted from the first pixel light-transmitting region P1, and wider than the waveband range of light emitted from the second pixel light-transmitting region P2. Specifically, the third pixel light-transmitting region P3 may be a red pixel light-transmitting region, the first pixel light-transmitting region P1 may be a blue pixel light-transmitting region, and the second pixel light-transmitting region P2 may be a green pixel light-transmitting region. That is, the first blocking structure Z1 may be provided at a gap between two adjacent red pixel light-transmitting regions that are at least partially adjacent to each other, as well as the spacer 2 is placed in the gap between the two adjacent red pixel light-transmitting regions.

In a possible implementation, referring to FIG. 2A-FIG. 2E, FIG. 3, FIG. 4A-FIG. 4C, FIG. 5, FIG. 6, FIG. 7, and FIG. 8, the orthographic projection of the first blocking structure Z1 on the base substrate 11 and the orthographic projection of the spacer 2 on the base substrate 11 are alternately distributed along the second direction Y. Specifically, the first blocking structure Z1, the spacer 2 may be located in the same one column direction, such as both being located in the column direction in which the third pixel light-transmitting regions P3 is located.

In a possible implementation, referring to FIG. 2A-FIG. 2E, FIG. 3, FIG. 4A-FIG. 4C, FIG. 5, FIG. 6, FIG. 7, and FIG. 8, the display panel further includes: a second blocking structure Z2; an orthographic projection of the second blocking structure Z2 on the base substrate 11 covers the orthographic projection of the spacer 2 on the base substrate 11. Specifically, the second blocking structure Z2 may be used to block the spacer 2, and the shape of the orthographic projection of the second blocking structure Z2 on the base substrate 11 may be the same as the shape of the orthographic projection of the spacer 2 on the base substrate 11. For example, the shape of the orthographic projection of the spacer 2 on the base substrate 11 may be a hexagon, octagon, circle, or ellipse; and the shape of the orthographic projection of the second blocking structure Z2 on the base substrate 11 may also be a hexagon, octagon, circle, or ellipse. A maximum length b1 of the first blocking structure Z1 in the second direction Y is less than a maximum length b2 of the second blocking structure Z2 in the second direction Y.

Specifically, a ratio of the maximum length b1 of the first blocking structure Z1 in the second direction Y to the maximum length b2 of the second blocking structure Z2 in the second direction Y is greater than or equal to 0.78. Specifically, the shape of the orthographic projection of the first blocking structure Z1 on the base substrate 11 is a rectangle, and the maximum length b1 of the first blocking structure Z1 in the second direction Y may be a length of a longitudinal edge of the rectangle along the second direction Y. The shape of the orthographic projection of the second blocking structure Z2 on the base substrate 11 is an octagon, and the maximum length b2 of the second blocking structure Z2 in the second direction Y may be a distance between two opposite edges, that are parallel to the first direction X, of the octagon.

Figure 3:
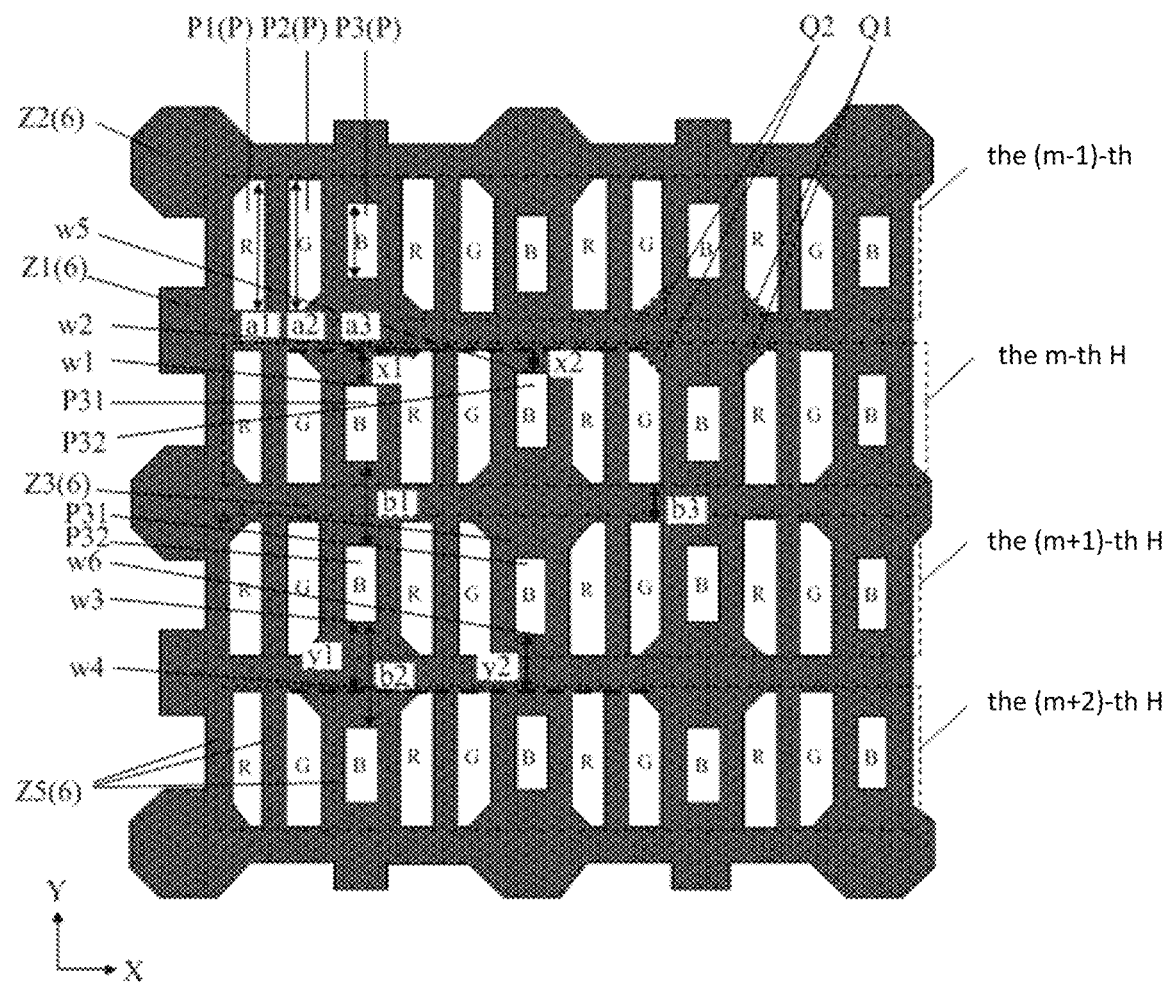
FIG. 3 is a second top view of a display panel provided by embodiments of the present disclosure.

In a possible implementation, referring to FIG. 3, the first blocking structure Z1, the second blocking structure Z2, and the third blocking structure Z3 satisfy the following relational equation:

$$2(a1 + b3) = 2a3 + b1 + b2;$$

a1 represents a maximum length of the first pixel light-transmitting region P1 in the second direction Y, a2 represents a maximum length of the second pixel light-transmitting region P2 in the second direction Y, a3 represents a maximum length of the third pixel light-transmitting region P3 in the second direction Y, b1 represents a maximum length of the first blocking structure Z1 in the second direction Y, b2 represents a maximum length of the second blocking structure Z2 in the second direction Y, and b3 represents a maximum length of the third blocking structure Z3 in the second direction Y.

In a possible implementation, referring to FIG. 3, the plurality of third pixel light-transmitting regions P3 in the pixel light-transmitting region row H includes: a plurality of first class of third pixel light-transmitting regions P31, and a plurality of second class of third pixel light-transmitting regions P32; an orthographic projection of the first class of third pixel light-transmitting regions P31 on the base substrate 1 is adjacent to an orthographic projection of the second blocking structure Z2, which is between the first class of third pixel light-transmitting region and the adjacent pixel light-transmitting region row H, on the base substrate 1, and an orthographic projection of the second class of third pixel light-transmitting region P32 on the base substrate 11 is adjacent to an orthographic projection of the first blocking structure Z1, which is between the second class of third pixel light-transmitting region and the adjacent pixel light-transmitting region row H, on the base substrate 11. It should be noted that the adjacent pixel light-transmitting region row H may be a previous pixel light-transmitting region row H in the gate signal scanning direction, i.e., the gate scanning signal is loaded first on the pixels in the previous pixel light-transmitting region row H, and then on the pixels in the current pixel light-transmitting region row.

In a possible implementation, referring to FIG. 3, the second blocking structure Z2 satisfies the following relational equation:

x1+y1=b2; b2 represents the maximum length of the second blocking structure Z2 in the second direction Y, x1 represents a distance between a first outer edge w1 and a second outer edge w2 in the second direction Y, the first outer edge w1 is an outer edge of the first class of third pixel light-transmitting region P31 of the m-th pixel light-transmitting region row H facing the (m−1)-th pixel light-transmitting region row H and extending along the first direction X, and the second outer edge w2 is an outer edge of the first pixel light-transmitting region P1 of the m-th pixel light-transmitting region row H facing the (m−1)-th pixel light-transmitting region row H and extending along the first direction X, y1 represents a distance between a third outer edge w3 and a fourth outer edge w4 in the second direction Y, the third outer edge w3 is an outer edge of the second class of third pixel light-transmitting region P32 in the (m+1)-th pixel light-transmitting region row H; the outer edge of the second class of third pixel light-transmitting region P32 in the (m+1)-th pixel light-transmitting region row H faces the (m+2)-th pixel light-transmitting region row H and extending along the first direction X, and the fourth outer edge w4 is an outer edge of the first pixel light-transmitting region P1 of the (m+2)-th pixel light-transmitting region row H facing the (m+1)-th pixel light-transmitting region row H and extending along the first direction X.

In a possible implementation, referring to FIG. 3, the third blocking structure Z3 satisfies the following relational equation:

x2+y2=b1; b1 represents the maximum length of the first blocking structure Z1 in the second direction Y, x2 represents a difference between a fifth outer edge w5 and the second outer edge w2 in the second direction Y, the fifth outer edge w5 is an outer edge of the second class the third pixel light-transmitting region P32 in the m-th pixel light-transmitting region row H; the outer edge of the second class the third pixel light-transmitting region P32 in the m-th pixel light-transmitting region row H faces the (m−1)-th pixel light-transmitting region row H and extending along the first direction X, y2 represents a difference between a sixth outer edge w6 and the fourth outer edge w4 in the second direction Y, and the sixth outer edge w6 is an outer edge of the first class of third pixel light-transmitting region P31 in the (m+1)-th pixel light-transmitting region row H; the outer edge of the first class of third pixel light-transmitting region P31 in the (m+1)-th pixel light-transmitting region row H faces the side of the (m+2)-th pixel light-transmitting region row H and extending along the first direction X.

In a possible implementation, see FIG. 3, the second blocking structure Z2 satisfies the following relational equation:

$$y1 - b3 = x1;$$

y2=b3=x2; b3 represents the maximum length of the third blocking structure Z3 in the second direction Y.

In a possible implementation, referring to FIG. 3, the third pixel light light-transmitting region P3 satisfies the following relational equation:

$$x1 = 2*x2.$$

It should be noted that the above is only an example illustration of the relevant dimensional relationship of the first blocking structure Z1, the second blocking structure Z2, and the third blocking structure Z3 by taking the structure shown in FIG. 3 as an example. In the specific implementation, for the structures of the display panel corresponding to FIG. 2A, FIG. 4A, FIG. 5, FIG. 6, FIG. 7, and FIG. 8, the related dimensional relationship of the above mentioned first blocking structure Z1, second blocking structure Z2, and third blocking structure Z3 may also be satisfied.

Specifically, a ratio of an area of the third pixel light-transmitting region P3 to an area of the first pixel light-transmitting region P1 is greater than 50%; and a ratio of the area of the third pixel light-transmitting region P3 to an area of the second pixel light-transmitting region P2 is greater than 50%. Specifically, the area of the first pixel light-transmitting region P1 may be equal to the area of the second pixel light-transmitting region P2.

Figure 11:
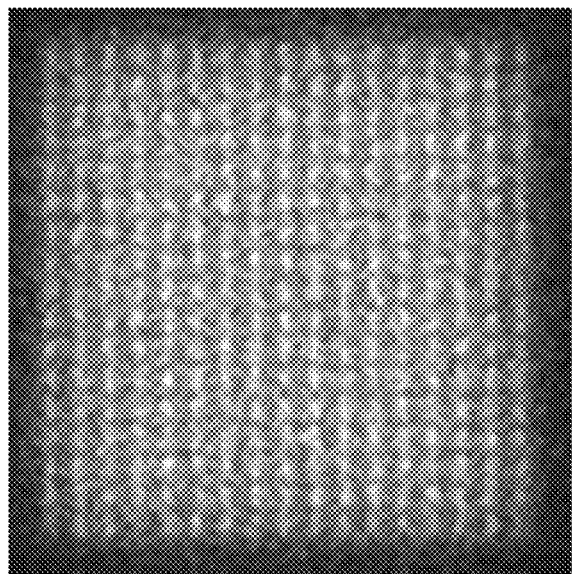
FIG. 11 is a simulation effect diagram of a first blocking structure Z1 in a gap between light-transmitting regions of blue pixels that are adjacent to each other and $b1/b2=100\%$.
Figure 12:
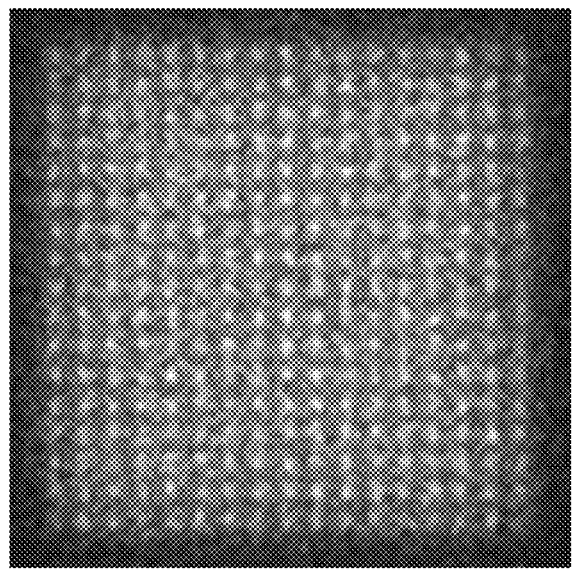
FIG. 12 is a simulation effect diagram of a first blocking structure Z1 in a gap between light-transmitting regions of blue pixels that are adjacent to each other and $b1/b2=78\%$.

As shown in FIG. 9-FIG. 12, in the embodiments of the present disclosure a screen door effect (SDE) simulation for the situation that the first blocking structures Z1 are placed at different pixels, as well as for different sizes of the first blocking structures Z1. FIG. 9 is a simulation effect diagram of placing the spacer 2 and the first blocking structure Z1 in the gap between the adjacent red pixel light-transmitting regions and b1/b2=51.7%, FIG. 10 is a simulation effect diagram of placing the spacer 2 and the first blocking structure Z1 in the gap between the adjacent blue pixel light-transmitting regions and b1/b2=51.7%, FIG. 11 is a simulation effect diagram of placing the spacer 2 and the first blocking structure Z1 in the gap between the adjacent blue pixel light-transmitting regions and b1/b2=100%, and FIG. 12 is a simulation effect diagram of placing the spacer 2 and the first blocking structure Z1 in the gap between the adjacent blue pixel light-transmitting regions and b1/b2=78%. As can be seen from FIG. 9-FIG. 12, the effect of the spacer 2 and the first blocking structure Z1 placed in the gap between the adjacent blue pixel light-transmitting regions is superior to that of the spacer 2 and the first blocking structure Z1 placed in the gap between the adjacent red pixel light-transmitting regions. When the spacer 2 and the first blocking structure Z1 placed in the gap between the adjacent blue pixel light-transmitting regions, for b1/b2=51.7%, obvious brick-like bright and dark images can viewed, while for b1/b2=78%, an SDE effect can be equivalent to that for b1/b2=100%. Therefore, in order to achieve a better SDE effect, the ratio of the maximum length b1 of the first blocking structure Z1 in the second direction Y to the maximum length b2 of the second blocking structure Z2 (i.e., the blocking object of the spacer 2) in the second direction Y is greater than or equal to 78%. The ratio of the area of the third pixel light-transmitting region P3 to the area of the first pixel light-transmitting region P3 is greater than 50%; and the ratio of the area of the third pixel light-transmitting region P3 to the area of the second pixel light-transmitting region P2 is greater than 50%.

In a possible implementation, referring to FIG. 2A-FIG. 2E, FIG. 3, FIG. 4A-FIG. 4C, FIG. 5, FIG. 6, FIG. 7, and FIG. 8, in the pixel light-transmitting region row H, the first pixel light-transmitting region P1, the second pixel light-transmitting region P2, and the third pixel light-transmitting region P3 are arranged sequentially along the first direction X; and the pixel light-transmitting regions P, light emitted from which is of the same waveband range, are located in the same one second direction Y. That is, the first pixel light-transmitting regions P1 are located in the same one column, the second pixel light-transmitting regions P2 are located in the same one column, and the third pixel light-transmitting regions P3 are located in the same one column. The first pixel light-transmitting region P1 is provided with a first missing portion Q1 on one side of the first pixel light-transmitting region facing the second blocking structure Z2; and the second pixel light-transmitting region P2 is provided with a second missing portion Q2 on one side of the second pixel light-transmitting region facing the second blocking structure Z2. In particular, the first missing portion Q1 may have a triangular shape, and the second missing portion Q2 may have a triangular shape. The first missing portion Q1 and the first pixel light-transmitting region P1 may form a complete rectangle; and the second missing portion Q2 and the second pixel light-transmitting region P2 may form a complete rectangle.

In a possible implementation, referring to FIG. 2A-FIG. 2E, FIG. 3, FIG. 4A-FIG. 4C, FIG. 5, FIG. 6, FIG. 7, and FIG. 8, the centers of the first pixel light-transmitting region P1, the second pixel light-transmitting region P2, and the third pixel light-transmitting region P3 may be located on one straight line k that is parallel to the first direction X. In contrast to the edge of the first pixel light-transmitting region P1 that is parallel to the first direction X, the edge of the second pixel light-transmitting region P2 that is parallel to the first direction X, the edge of the third pixel light-transmitting region P3 that is parallel to the first direction X is closer to the straight line k.

In a possible implementation, referring to FIG. 2A-FIG. 2E, FIG. 3, FIG. 4A-FIG. 4C, FIG. 5, FIG. 6, FIG. 7, and FIG. 8, the orthographic projection of the first blocking structure Z1 on the base substrate 11 may be a rectangle.

In a possible implementation, referring to FIG. 2A-FIG. 2E, FIG. 3, FIG. 4A-FIG. 4C, FIG. 5, FIG. 6, FIG. 7, and FIG. 8, the display panel further includes: the third blocking structure Z3, wherein the third blocking structure Z3 extends along the first direction X and an orthographic projection of the third blocking structure Z3 on the base substrate 11 is located in the gap between two adjacent pixel light-transmitting region rows H. The maximum length b1 of the first blocking structure Z1 in the second direction Y is greater than the length b3 of the third blocking structure Z3 in the second direction Y. Specifically, the third blocking structure Z3 may serve as a primary blocking object in the first direction X. Specifically, the third blocking structure Z3 may be located in the array substrate, and specifically may be fabricated using a light-shielding layer (i.e., an LS layer, which may be used to block external light irradiated to the active layer of the transistor) or a gate line layer of the array substrate, which may reduce the risk of light leakage occurring from a via hole (which may be a via hole used to conduct the pixel electrode and the drain of the transistor) in a flat layer of the array substrate.

In a possible implementation, the maximum length b1 of the first blocking structure Z1 in the second direction Y may be in the range of 8 μm to 12 μm, specifically, for example, it may be 8 μm, 9 μm, 10 μm, 10.5 μm, 11 μm, or 12 μm; the maximum length b2 of the second blocking structure Z2 in the second direction Y may be in the range of 10 μm to 15 μm, specifically, for example, it may be 10 μm, 11 μm, 12 μm, 13 μm, 13.5 μm, 14 μm, or 15 μm; and the maximum length b3 of the third blocking structure Z3 in the second direction Y may be in the range of 5 μm to 10 μm, specifically, for example, it may be 5 μm, 6 μm, 7 μm, 7.5 μm, 8 μm, 9 μm, or 10 μm.

In a possible implementation, referring to FIG. 2A-FIG. 2E, FIG. 3, FIG. 4A-FIG. 4C, FIG. 5, FIG. 6, FIG. 7, and FIG. 8, the display panel further includes: a fourth blocking structure Z4, and a fifth blocking structure Z5. The fourth blocking structure Z4 extends along the first direction X and an orthographic projection of the fourth blocking structure on the base substrate 11 is located in the gap between two adjacent pixel light-transmitting region rows H; and the fifth blocking structure Z5 extends along the second direction Y and an orthographic projection of the fifth blocking structure on the base substrate 11 is located in a gap between two adjacent pixel light-transmitting regions P. The orthographic projection of the third blocking structure Z3 on the base substrate 11 covers the orthographic projection of the fourth blocking structure Z4 on the base substrate 11. Specifically, the fourth blocking structure Z4 may serve as a secondary blocking object in the first direction X.

Figure 2B:
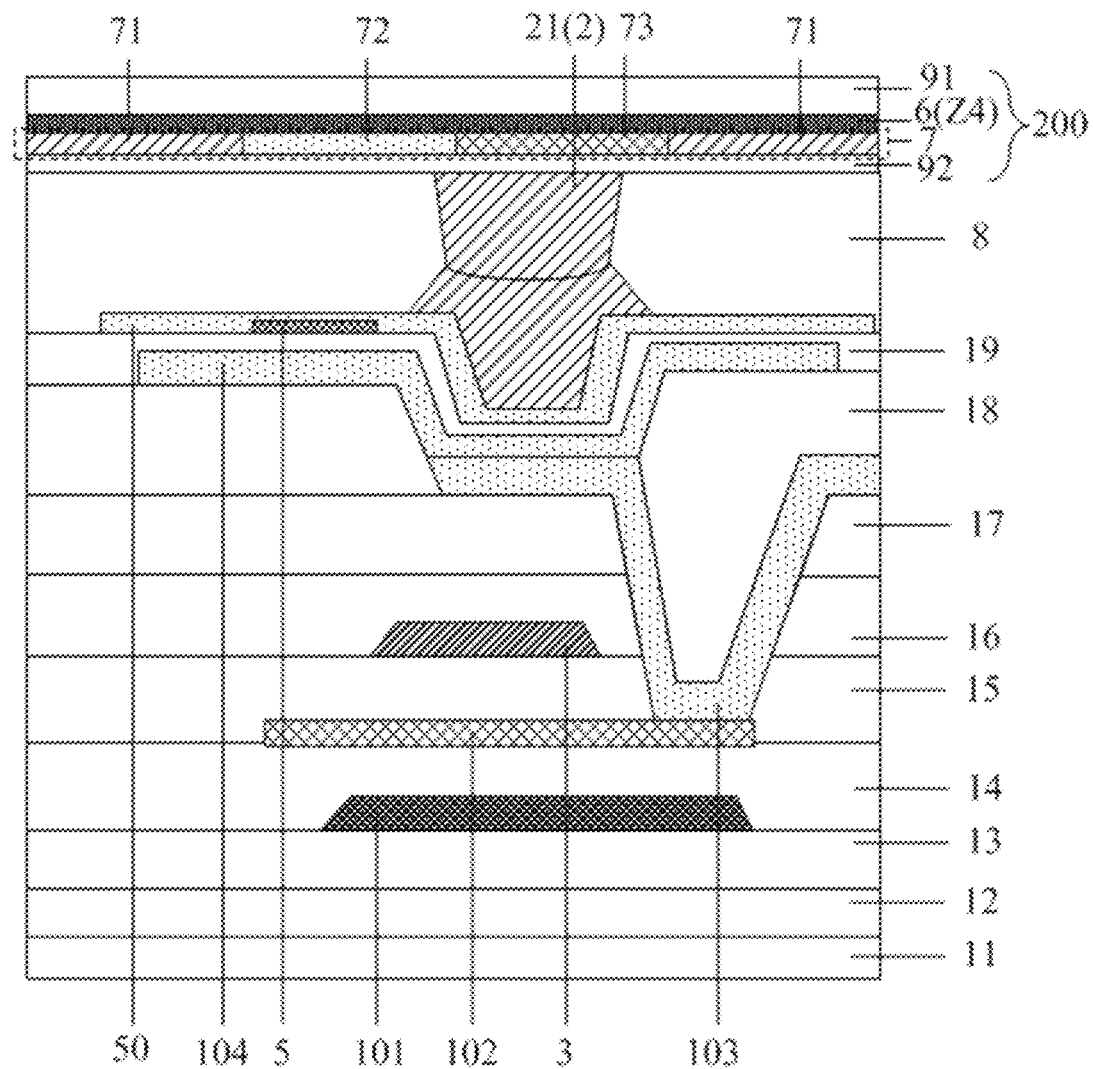
FIG. 2B is a cross-sectional schematic diagram of a periphery of spacers in FIG. 2A.
Figure 2C:
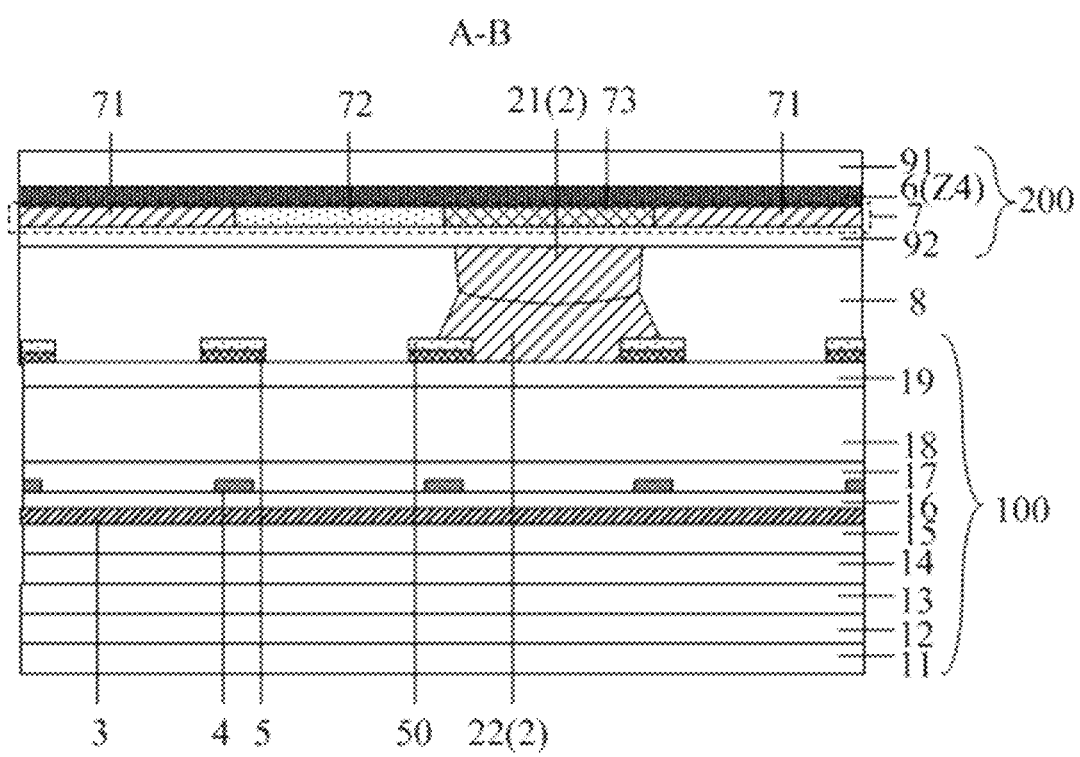
FIG. 2C is a cross-sectional schematic diagram of FIG. 2A at a dotted line AB.
Figure 2D:
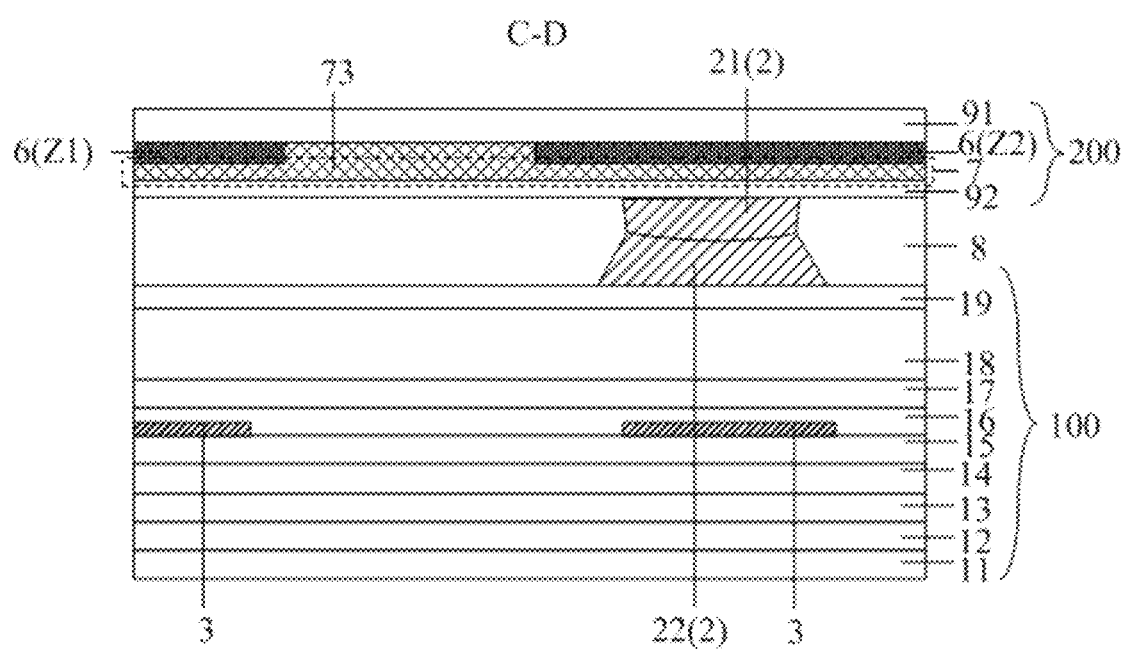
FIG. 2D is a cross-sectional schematic diagram of FIG. 2A at a dotted line CD.
Figure 2E:
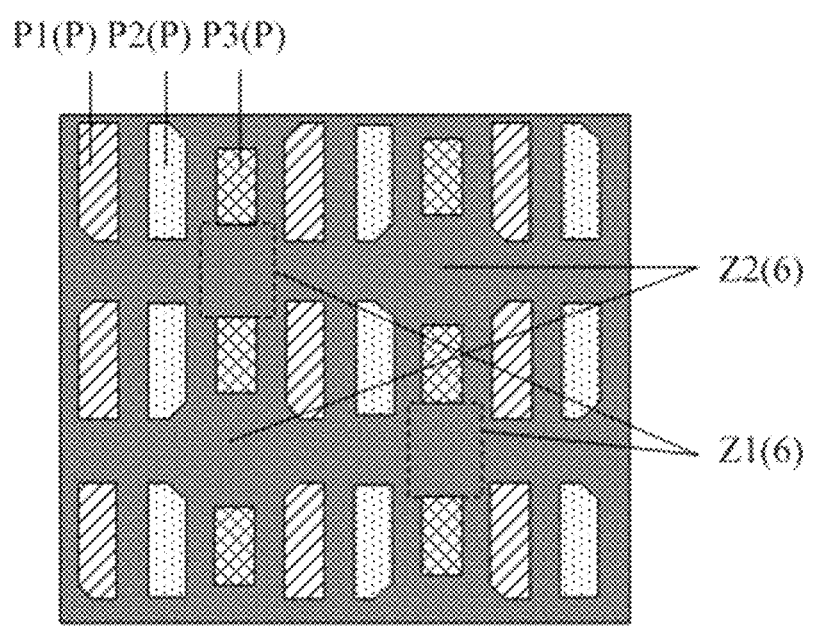
FIG. 2E a schematic diagram of a pixel design provided by embodiments of the present disclosure.
Figure 2F:
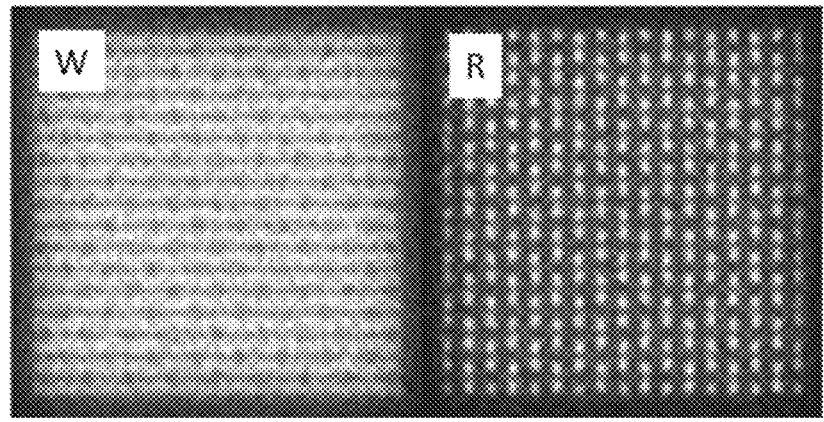
FIG. 2F is a screen door effect of a related pixel design when displaying a white screen and a red image.
Figure 2G:
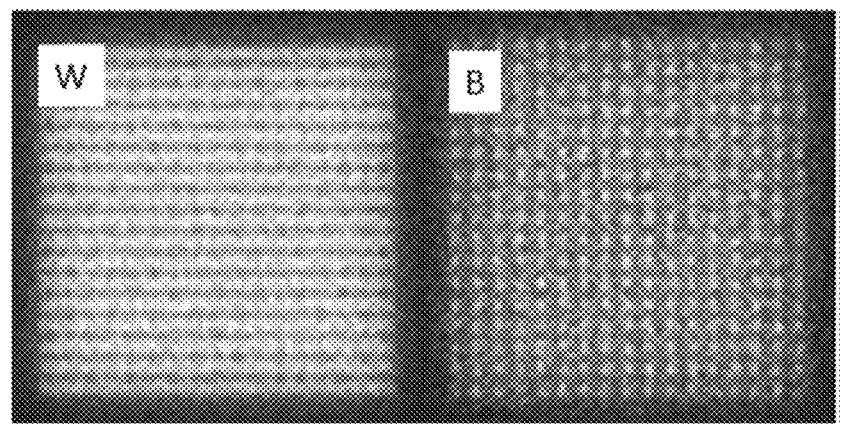
FIG. 2G is a screen door effect of a pixel design when displaying a white image and a blue image provided by embodiments of the present disclosure.
Figure 4A:
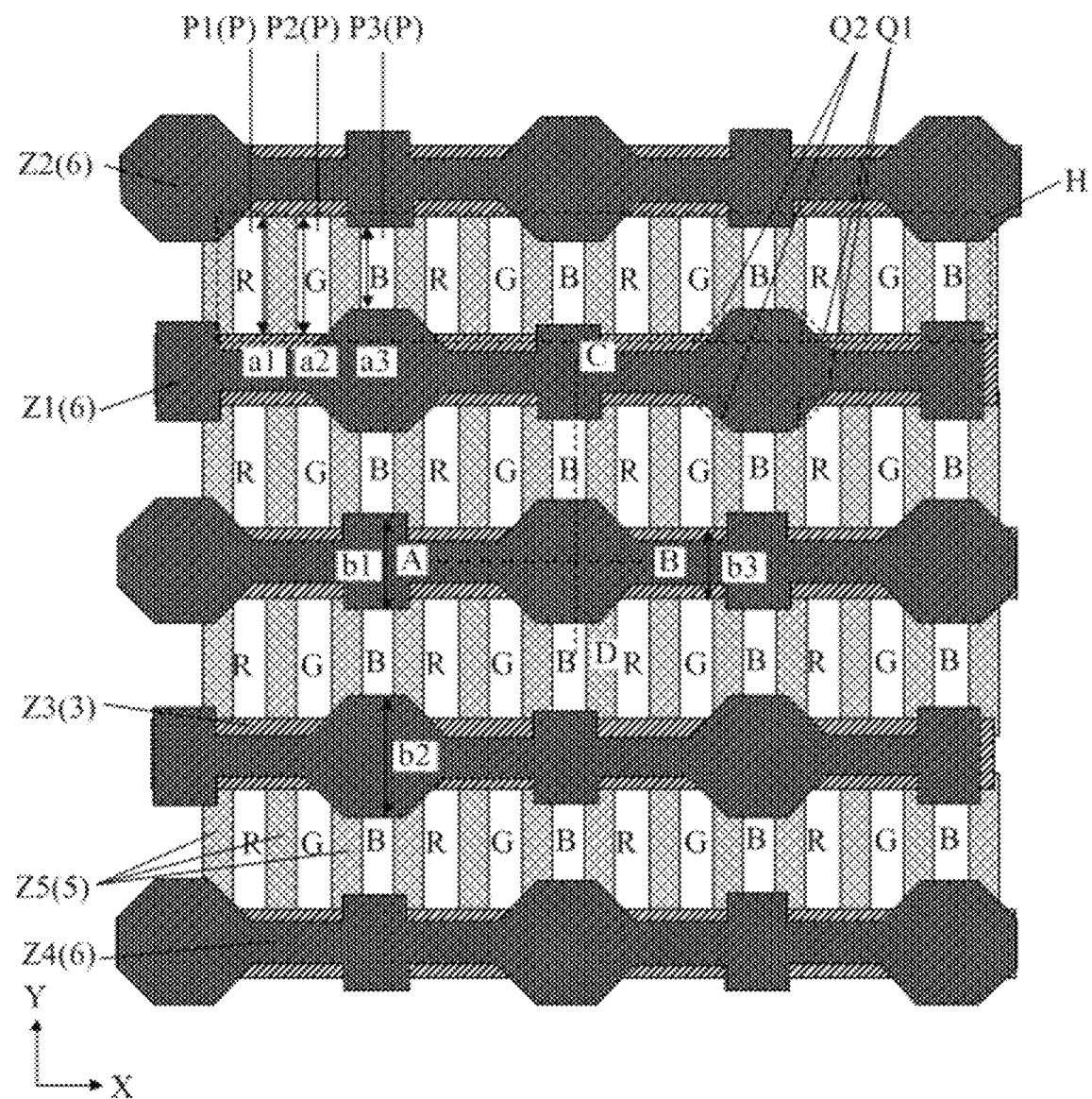
FIG. 4A is a third top view of a display panel provided by embodiments of the present disclosure.
Figure 4B:
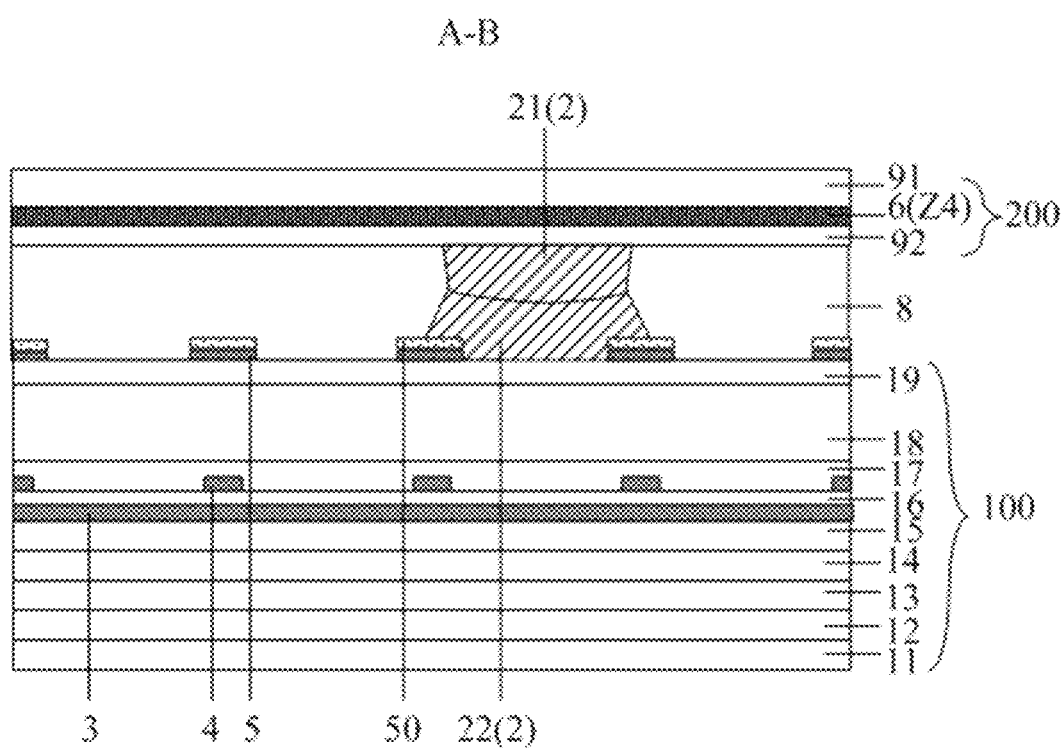
FIG. 4B is a cross-sectional schematic diagram of FIG. 4A at a dotted line AB.

In a possible implementation, referring to FIG. 2A-FIG. 2E, FIG. 4A-FIG. 4C, wherein FIG. 2B may be a cross-sectional schematic diagram of the spacer in FIG. 2A, FIG. 2C may be a cross-sectional schematic diagram of FIG. 2A at a dotted line AB, FIG. 2D may be a cross-sectional schematic diagram of FIG. 2A at a dotted line CD; FIG. 4B may be a cross-sectional schematic diagram of FIG. 4A at a dotted line AB, FIG. 4C may be a cross-sectional schematic diagram of FIG. 4A at a dotted line CD. The display panel includes: an array substrate 100 and an opposing substrate 200 disposed opposite each other. The array substrate 100 includes: the base substrate 11, the first light-shielding metal layer on one side of the base substrate 11 (which may include: a gate line layer 3 and/or a light-shielding layer 101), a second light-shielding metal layer 5 on one side of the first light-shielding metal layer away from the base substrate 11. Specifically, the array substrate 100 may further include: a data line layer 3 between the first light-shielding metal layer and the second light-shielding metal layer 5. The opposing substrate 200 includes: the black matrix 6. Specifically, the array substrate 100 may include a buffer layer 12, a first active layer (not shown in the figure), a first gate insulating layer 13, a light-shielding layer 101, a first interlayer dielectric layer 14, a second active layer 102, a second gate insulating layer 15, a gate line layer 3, a second interlayer dielectric layer 16, a data line layer 4, a third interlayer dielectric layer 17, a first lap electrode layer 103, a first flat layer 18, a pixel electrode layer 104, a passivation layer 19, a common metal layer 5, and a common electrode layer 50 that are disposed sequentially on one side of the base substrate 11. The opposing substrate 200 may include an opposing base substrate 91 and an optical adhesive layer 92 on one side of the black matrix 6 away from the opposing base substrate 91. Specifically, the first light-shielding metal layer may include: a gate line layer 3 and/or a light-shielding layer 101. Specifically, a liquid crystal layer 8 may also be disposed between the array substrate 100 and the opposing substrate 200. Specifically, referring to FIG. 2A-FIG. 2E, and FIG. 4A-FIG. 4C, the spacer 2 may include a first spacer 21 disposed in the array substrate, and a second spacer 22 disposed in the opposing substrate. An orthographic projection of the first spacer 21 on the base substrate 11 may cover an orthographic projection of the second spacer 22 on the base substrate 11.

Specifically, the material of the first active layer may include: polysilicon. Specifically, the first active layer may be an active layer in a transistor(s) of a gate drive circuit in a non-display region. That is, considering that the current design of a high transition oxide gate drive circuit is not mature enough, which may result in a large size of the transistor in the gate drive circuit, leading to an oversized bezel, in the embodiments of the present disclosure, a low-temperature polycrystalline silicon transistor design may be used in the gate drive circuit in the non-display region.

Specifically, the second active layer may be an oxide active layer. In the embodiments of the present disclosure, the second active layer of the transistor(s) in the display region may adopt an oxide active layer, and the transistor(s) in the non-display region may adopt a polycrystalline silicon active layer. That is, the thin-film transistor with the oxide active layer has advantages such as a low leakage current, and the thin-film transistor with the low-temperature polycrystalline silicon has advantages such as a high mobility and a fast charging rate, etc. The thin-film transistor with the low-temperature polycrystalline silicon and the thin-film transistor with the oxide are integrated in a display panel to form a low-temperature polycrystalline oxide display panel, utilizing the advantages of both, which realize the high resolution (Pixel Per Inch, PPI) and low-frequency drive, reduces the power consumption, and improves the display quality.

Specifically, referring to FIG. 2A-FIG. 2E and FIG. 4A-FIG. 4C, the second light-shielding metal layer 5 (common metal) may be disposed in the array substrate, and the display panel may further include a common electrode layer 50 that is in direct contact with the second light-shielding metal layer 5. On the one hand, the second light-shielding metal layer 5 may be used to block the gate lines and/or the data lines, and on the other hand, may reduce the resistance of the common electrodes. Specifically, the material of the second light-shielding metal layer 5 may be metal; the material of the common electrode layer 50 may be indium tin oxide.

In a possible implementation, at least one of the first blocking structure Z1, the second blocking structure Z2, the third blocking structure Z3, the fourth blocking structure Z4, and the fifth blocking structure Z5 is in the same one layer with a first light-shielding metal layer including: a gate line layer 3 and/or a light-shielding layer 101,
a second light-shielding metal layer 5, or
a black matrix 6.

In a possible implementation, referring to FIG. 2A-FIG. 2E, and FIG. 4A-FIG. 4C, the display panel further includes: a color film layer 7; wherein the color film layer 7 is disposed in the opposing substrate 200, or, the color film layer 7 is disposed in the array substrate 100.

Specific examples of different film layers used to fabricate the first blocking structure Z1, the second blocking structure Z2, the third blocking structure Z3, the fourth blocking structure Z4, and the fifth blocking structure Z5 are described below.

In the embodiment 1, referring to FIG. 2A-FIG. 2E, the colored film layer 7 is located in the opposing substrate 200. In the first direction X, the gate line layer 3 (or the light-shielding layer 101) is used as the primary light-shielding object (i.e., the third blocking structure Z3 is fabricated using the gate line layer 3 or the light-shielding layer 101), and the black matrix 6 is used as the secondary light-shielding object (i.e., the fourth blocking structure Z4 is fabricated using the black matrix 6) to reduce the reflectivity. The first blocking structure Z1, the second blocking structure Z2, and the fifth blocking structure Z5 are also fabricated using the black matrix 6.

In the embodiment 2, referring to FIG. 3, the color film layer 7 is located in the opposing substrate 200. In the first direction X, the black matrix 6 is used as the primary light-shielding object (i.e., the third blocking structure Z3 is fabricated using the black matrix 6), and the first blocking structure Z1, the second blocking structure Z2, and the fifth blocking structure Z5 are also fabricated using the black matrix 6. Compared to the embodiment 1, in the embodiment 2, the primary light-shielding object (i.e., the third blocking structure Z3) in the first direction X is replaced with the black matrix 6 in the opposing substrate 200.

In the embodiment 3, the color film layer 7 is located in the opposing substrate 200. In the first direction X, the gate line layer 3 (or the light-shielding layer 101) is used as the primary light-shielding object (i.e., the third blocking structure Z3 is fabricated using the gate line layer 3 or the light-shielding layer 101), and the black matrix 6 is used as the secondary light-shielding object (i.e., the fourth blocking structure Z4 is fabricated using the black matrix 6) to reduce the reflectivity. The first blocking structure Z1, the second blocking structure Z2, the second blocking structure Z2, and the fifth blocking structure Z5 are also fabricated using the gate line layer 3 (or the light-shielding layer 101). Compared to the embodiment 1, in the embodiment 3, the gate line layer 3 (or the light-shielding layer 101) is used to fabricate the first blocking structure Z1 and the second blocking structure Z2.

Figure 4C:
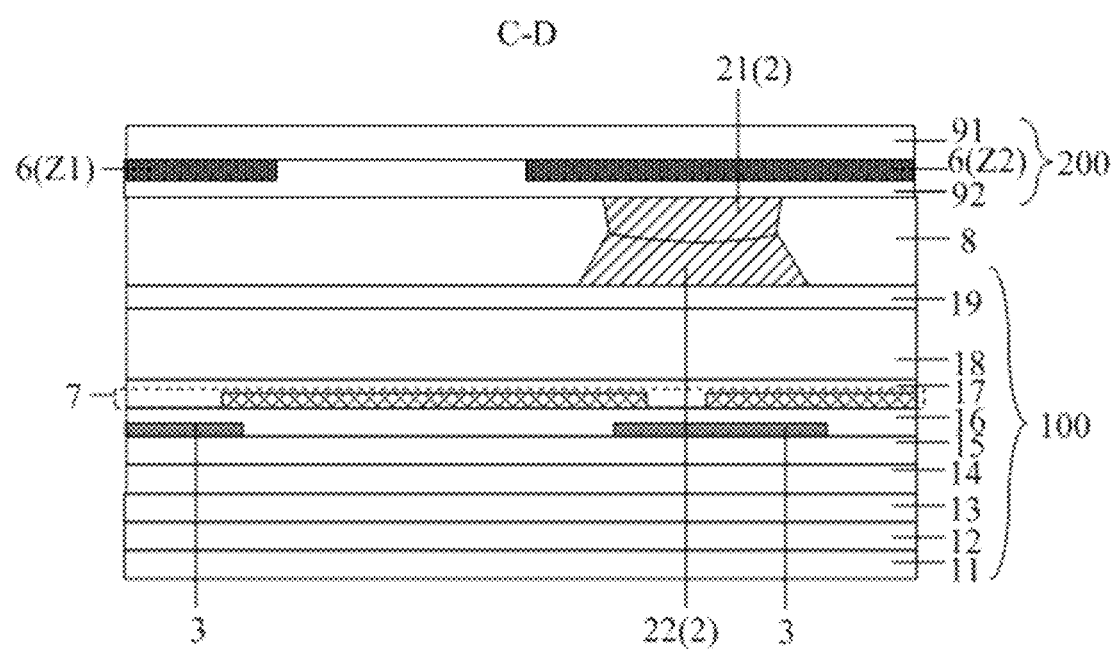
FIG. 4C is a cross-sectional schematic diagram of FIG. 4A at a dotted line CD.

In the embodiment 4, as shown in FIG. 4A-FIG. 4C, the colored film layer 7 is located in the array substrate 200. In the first direction X, the gate line layer 3 (or the light-shielding layer 101) is used as the primary light-shielding object (i.e., the third blocking structure Z3 is fabricated using the gate line layer 3 or the light-shielding layer 101), and the black matrix 6 is used as the secondary light-shielding object (i.e., the fourth blocking structure Z4 is fabricated using the black matrix 6) to reduce the reflectivity. The first blocking structure Z1 and the second blocking structure Z2 are also fabricated using the black matrix 6. In the second direction Y, the fifth blocking structure Z5 adopts the second shielding metal layer 5 to shield light.

Figure 5:
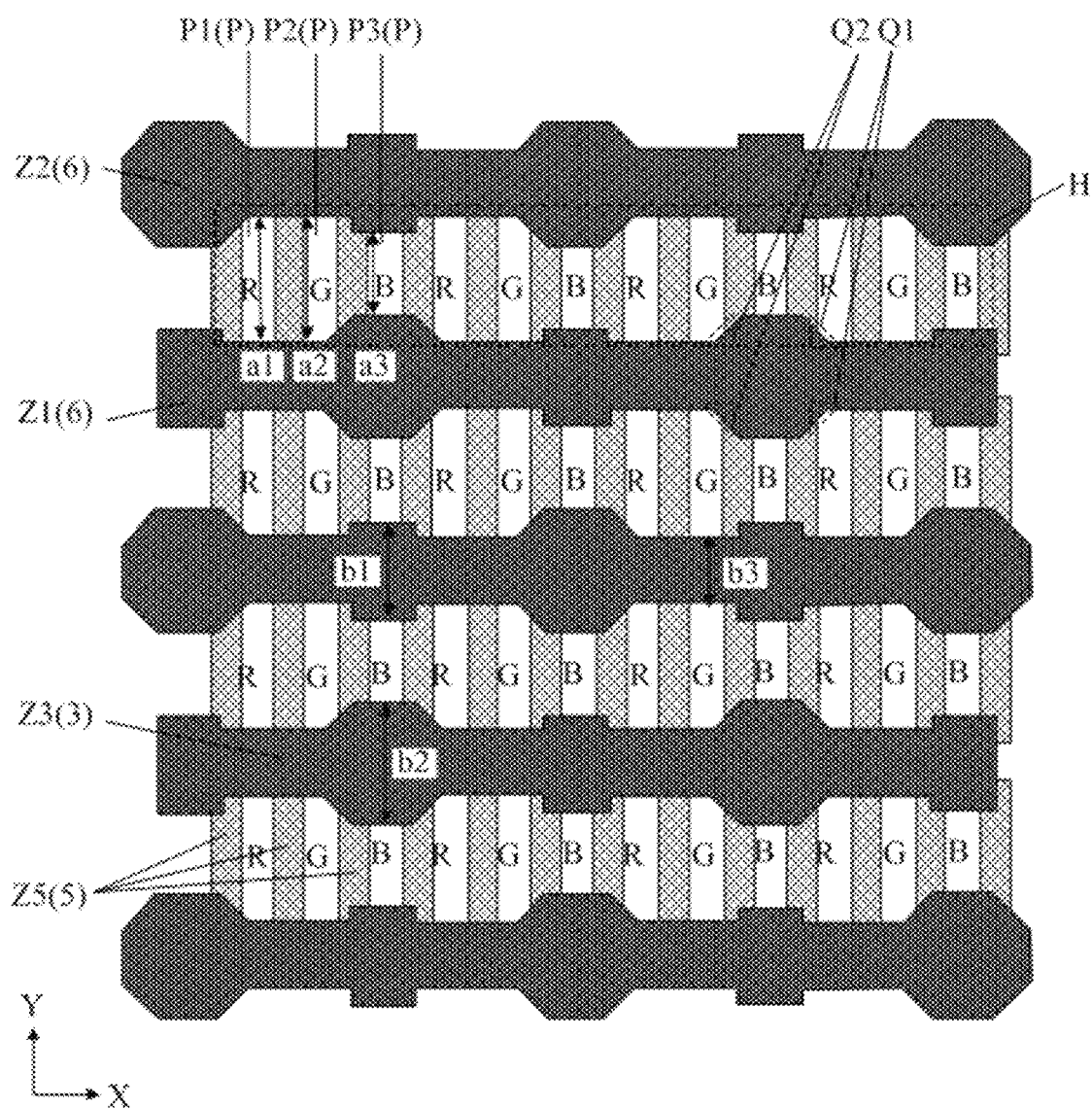
FIG. 5 is a fourth top view of a display panel provided by embodiments of the present disclosure.

In the embodiment 5, referring to FIG. 5, the colored film layer 7 is located in the array substrate 200. In the first direction X, the black matrix 6 is used as the primary light-shielding object (i.e., the third blocking structure Z3 is fabricated using the black matrix 6), and the gate line layer 3 (or the light-shielding layer 101) is used as the secondary light-shielding object (i.e., the fourth blocking structure Z4 is fabricated using the gate line layer 3 or the light-shielding layer 101). The first blocking structure Z1 and the second blocking structure Z2 are also fabricated using the black matrix 6. In the second direction Y, the fifth blocking structure Z5 adopts the second light-shielding metal layer 5 to shield light. Compared to the embodiment 4, in the embodiment 5, the gate line layer 3 (or the light-shielding layer) are used as the third blocking structure Z3.

Figure 6:
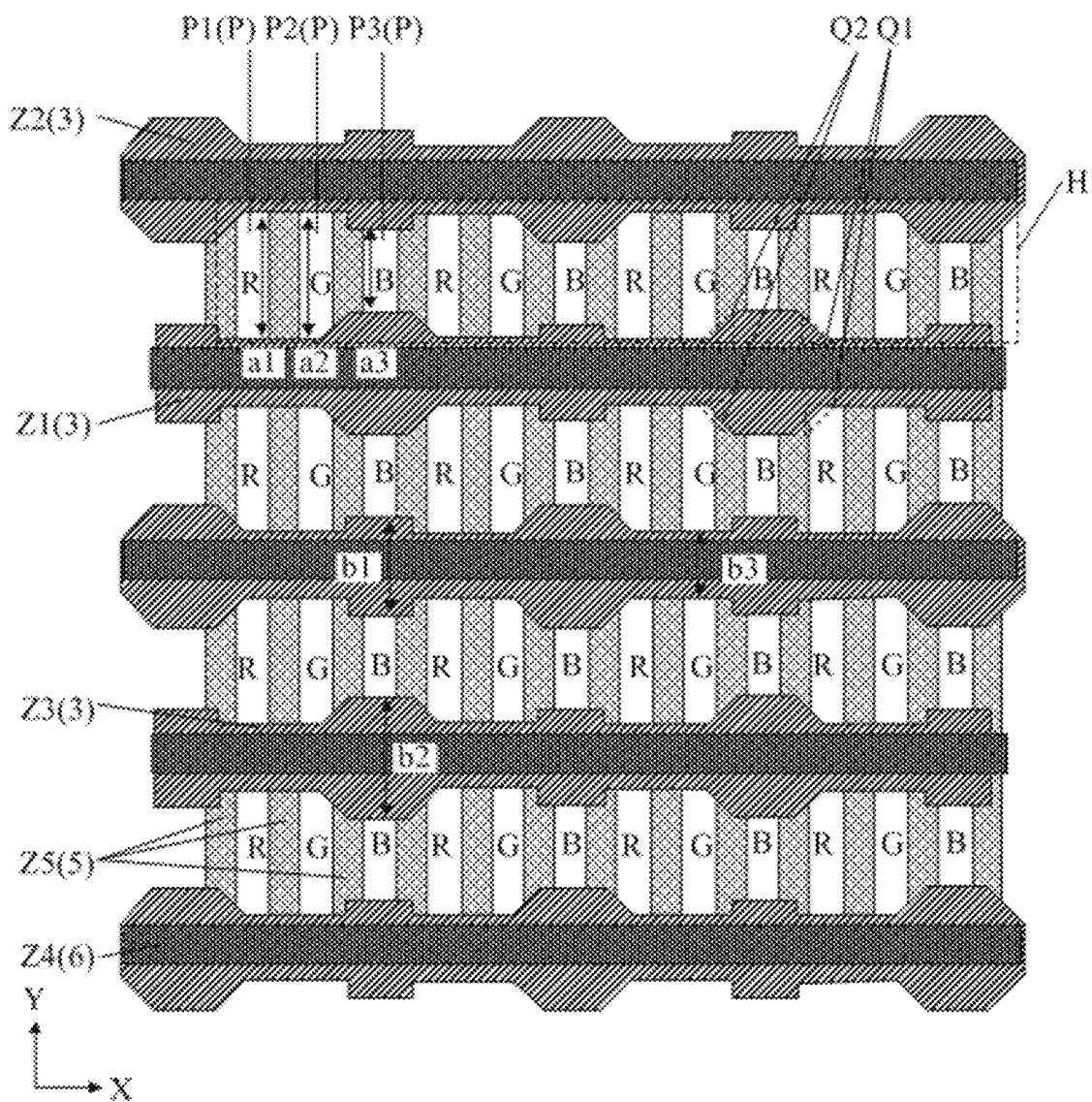
FIG. 6 is a fifth top view of a display panel provided by embodiments of the present disclosure.

In the embodiment 6, as shown in FIG. 6, the colored film layer 7 is located in the array substrate 200. In the first direction X, the gate line layer 3 (or the light-shielding layer 101) is used as the primary light-shielding object (i.e., the third blocking structure Z3 is fabricated using the gate line layer 3 or the light-shielding layer 101), and the black matrix 6 is used as the secondary light-shielding object (i.e., the fourth blocking structure Z4 is fabricated using the black matrix 6) to reduce the reflectivity. The first blocking structure Z1 and the second blocking structure Z2 are fabricated using the gate line layer 3 (or light-shielding layer). In the second direction Y, the fifth blocking structure Z5 adopts the second shielding metal layer 5 to shield light. Compared to the embodiment 5, in embodiment 6, the gate line layer 3 (or the light-shielding layer) is used to fabricate the first blocking structure Z1 and the second blocking structure Z2.

Figure 7:
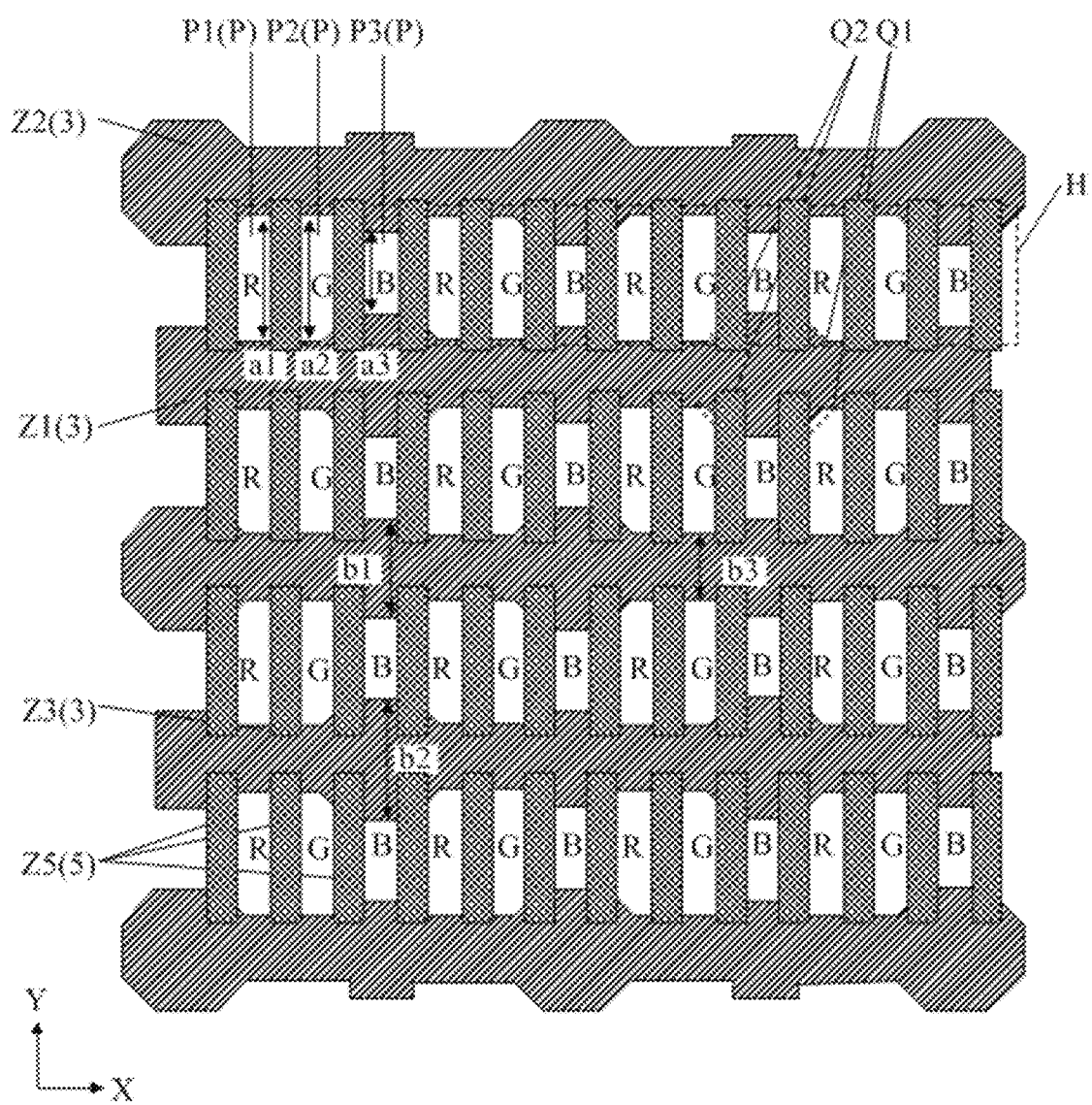
FIG. 7 is a sixth top view of a display panel provided by embodiments of the present disclosure.
Figure 8:
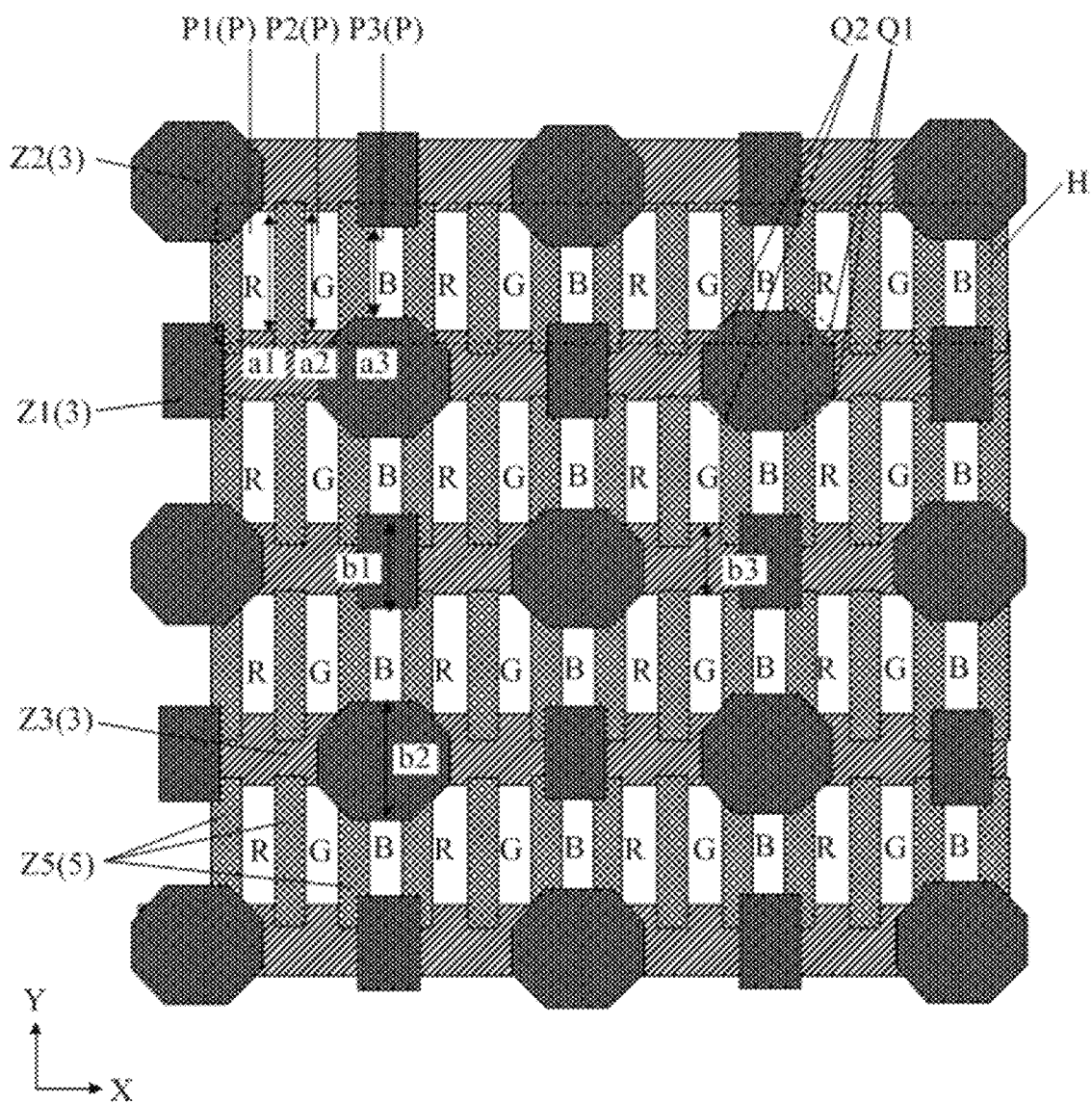
FIG. 8 is a seventh top view of a display panel provided by embodiments of the present disclosure.

In the embodiment 7, as shown in FIG. 7, the colored film layer 7 is located in the array substrate 200. In the first direction X, the gate line layer 3 (or the light-shielding layer 101) is used as the primary light-shielding object (i.e., the third blocking structure Z3 is fabricated using the gate line layer 3 or the light-shielding layer 101), and the first light-blocking structure Z1 and the second light-blocking structure Z2 are fabricated using the gate line layer 3 (or the light-shielding layer 101). In the second direction Y, the fifth light-blocking structure Z5 adopts the second shielding metal layer 5 to shield light. Compared to the embodiment 6, in the embodiment 7, the secondary light-shielding object (i.e., the fourth blocking structure Z4) fabricated by the black matrix 6 in the first direction X is removed.

In the embodiment 8, as shown in FIG. 8 and FIG. 4A-FIG. 4C, the colored film layer 7 is located in the array substrate 200. In the first direction X, the gate line layer 3 (or the light-shielding layer 101) is used as the primary light-shielding object (i.e., the third blocking structure Z3 is fabricated using the gate line layer 3 or the light-shielding layer 101), and the first blocking structure Z1 and the second blocking structure Z2 are fabricated using the black matrix 6. In the second direction Y, the fifth blocking structure Z5 adopts the second shielding metal layer 5 to shield light. Compared to the embodiment 4, in the embodiment 8, the secondary light-shielding object (i.e., the fourth blocking structure Z4) of the material of the black matrix 6 in the first direction X is removed.

Based on the same inventive concept, embodiments of the present disclosure also provide a display apparatus, including the display panel provided by the embodiments of the present disclosure.

Although preferred embodiments of the present disclosure have been described, those skilled in the art may make additional changes and modifications to these embodiments once the underlying inventive concept is known. Therefore, the appended claims are intended to be construed to include the preferred embodiments as well as all changes and modifications that fall within the scope of the present disclosure.

Obviously, those skilled in the art may make various modifications and variations to the embodiments of the present disclosure without departing from the spirit and scope of the embodiments of the present disclosure. Thus, if these modifications and variations of the embodiments of the present disclosure fall within the scope of the claims of the present disclosure and their technical equivalents, the present disclosure is intended to encompass these modifications and variations as well.

What is claimed is:

1. A display panel, comprising:
a base substrate;
a plurality of pixel light-transmitting regions, wherein the plurality of pixel light-transmitting regions comprise: a plurality of pixel light-transmitting region rows extending in a first direction and arranged in a second direction; at least one pixel light-transmitting region row of the plurality of pixel light-transmitting region rows comprises: a first pixel light-transmitting region, a second pixel light-transmitting region, and a third pixel light-transmitting region; a length of the third pixel light-transmitting region in the second direction is less than a length of the first pixel light-transmitting region in the second direction, and is less than a length of the second pixel light-transmitting region in the second direction;
a first blocking structure on a side of the base substrate, wherein an orthographic projection of the first blocking structure on the base substrate is in a gap between orthographic projections of two third pixel light-transmitting regions in the second direction that are at least partially adjacent to each other on the base substrate; and
a spacer, wherein an orthographic projection of the spacer on the base substrate is in a gap between orthographic projections of two third pixel light-transmitting regions that are partially adjacent to each other on the base substrate, and the orthographic projection of the spacer on the base substrate does not overlap with the orthographic projection of the first blocking structure on the base substrate.

2. The display panel according to claim 1, wherein the length of the first pixel light-transmitting region in the second direction is equal to the length of the second pixel light-transmitting region in the second direction; and a waveband range of light emitted from the third pixel light-transmitting region is narrower than a waveband range of light emitted from the first pixel light-transmitting region and is narrower than a waveband range of light emitted from the second pixel light-transmitting region.

3. The display panel according to claim 1, wherein the orthographic projection of the first blocking structure on the base substrate and the orthographic projection of the spacer on the base substrate are alternately distributed along the second direction.

4. The display panel according to claim 1, further comprising: a second blocking structure; wherein an orthographic projection of the second blocking structure on the base substrate covers the orthographic projection of the spacer on the base substrate;
wherein a maximum length of the first blocking structure in the second direction is less than a maximum length of the second blocking structure in the second direction.

5. The display panel according to claim 1, wherein in the pixel light-transmitting region row, the first pixel light-transmitting region, the second pixel light-transmitting region, and the third pixel light-transmitting region arranged sequentially along the first direction; and pixel light-transmitting regions of the same waveband range, are in the same one second direction;
the first pixel light-transmitting region is provided with a first missing portion on one side facing the second blocking structure, of the first pixel light-transmitting region; and the second pixel light-transmitting region is provided with a second missing portion on one side facing the second blocking structure, of the second pixel light-transmitting region.

6. The display panel according to claim 4, wherein a ratio of the maximum length of the first blocking structure in the second direction to the maximum length of the second blocking structure in the second direction is greater than or equal to 0.78.

7. The display panel according to claim 1, wherein a ratio of an area of the third pixel light-transmitting region to an area of the first pixel light-transmitting region is greater than 50%; and a ratio of the area of the third pixel light-transmitting region to an area of the second pixel light-transmitting region is greater than 50%.

8. The display panel according to claim 4, wherein the orthographic projection of the first blocking structure on the base substrate is a rectangle; and the orthographic projection of the second blocking structure on the base substrate is a hexagon, octagon, circle, or ellipse.

9. The display panel according to claim 8, further comprising: a third blocking structure, wherein the third blocking structure extends in the first direction and an orthographic projection of the third blocking structure on the base substrate is in a gap between two pixel light-transmitting region rows that are adjacent to each other; and
a length of the first blocking structure in the second direction is greater than a length of the third blocking structure in the second direction.

10. The display panel according to claim 9, wherein the first blocking structure, the second blocking structure, and the third blocking structure satisfy a following relational equation:

$$2(a1 + b1) = 2a3 + b1 + b2;$$

wherein a1 represents a maximum length of the first pixel light-transmitting region in the second direction, a2 represents a maximum length of the second pixel light-transmitting region in the second direction, a3 represents a maximum length of the third pixel light-transmitting region in the second direction, b1 represents a maximum length of the first blocking structure in the second direction, b2 represents a maximum length of the second blocking structure in the second direction and b3 represents a maximum length of the third blocking structure in the second direction.

11. The display panel according to claim 10, wherein a plurality of third pixel light-transmitting regions in the pixel light-transmitting region row comprise: a plurality of first class of third pixel light-transmitting regions, and a plurality of second class of third pixel light-transmitting regions; wherein an orthographic projection of the first class of third pixel light-transmitting regions on the base substrate is adjacent to an orthographic projection of the second blocking structure on the base substrate, the second blocking structure is between the first class of third pixel light-transmitting regions and an adjacent pixel light-transmitting region row, and an orthographic projection of the second class of third pixel light-transmitting regions on the base substrate is adjacent to an orthographic projection of the first blocking structure on the base substrate, the first blocking structure is between the second class of third pixel light-transmitting regions and the adjacent pixel light-transmitting region row.

12. The display panel according to claim 11, wherein the second blocking structure satisfies a following relational equation:

$$x1 + y1 = b2;$$

wherein b2 represents the maximum length of the second blocking structure in the second direction, x1 represents a distance between a first outer edge and a second outer edge in the second direction, the first outer edge is an outer edge of the first class of third pixel light-transmitting region facing the (m−1)-th pixel light-transmitting region row and extending in the first direction, of the m-th pixel light-transmitting region row, the second outer edge is an outer edge facing the (m−1)-th pixel light-transmitting region row and extending in the first direction, of the first pixel light-transmitting region of the m-th pixel light-transmitting region row; y1 represents a distance between a third outer edge and a fourth outer edge in the second direction, and the third outer edge is an outer edge of the second class of third pixel light-transmitting region in the (m+1)-th pixel light-transmitting region row, the outer edge of the second class of third pixel light-transmitting region in the (m+1)-th pixel light-transmitting region row faces the (m+2)-th pixel light-transmitting region row and extending in the first direction; and the fourth outer edge is an outer edge facing the (m+1)-th pixel light-transmitting region row and extending in the first direction, of the first pixel light-transmitting region of the (m+2)-th pixel light-transmitting region row.

13. The display panel according to claim 12, wherein the third blocking structure satisfies a following relational equation:

$$x2 + y2 = b1;$$

wherein b1 represents the maximum length of the first blocking structure in the second direction, x2 represents a difference between a fifth outer edge and the second outer edge in the second direction, the fifth outer edge is an outer edge of the second class of third pixel light-transmitting region in the m-th pixel light-transmitting region row, the outer edge of the second class of third pixel light-transmitting region in the m-th pixel light-transmitting region row faces the (m−1)-th pixel light-transmitting region row and extending in the first direction; y2 represents a difference between a sixth outer edge and the fourth outer edge in the second direction, and the sixth outer edge is an outer edge of the first class of third pixel light-transmitting region in the (m+1)-th pixel light-transmitting region row, the outer edge of the first class of third pixel light-transmitting region in the (m+1)-th pixel light-transmitting region row faces the (m+2)-th the pixel light-transmitting region row and extending in the first direction.

14. The display panel according to claim 13, wherein the second blocking structure satisfies a following relational equation:

$$y1 - b3 = x1;$$
$$y2 - b3 = x2;$$

wherein b3 represents the maximum length of the third blocking structure in the second direction.

15. The display panel according to claim 13, wherein the third pixel light-transmitting region satisfies a following relationship equation:

$$x1 = 2*x2.$$

16. The display panel according to claim 9, further comprising: a fourth blocking structure, and a fifth blocking structure; wherein the fourth blocking structure extends in the first direction and an orthographic projection of the fourth blocking structure on the base substrate is in a gap between two pixel light-transmitting region rows that are adjacent to each other, and the fifth blocking structure extends in the second direction and an orthographic projection of the fifth blocking structure on the base substrate is in a gap between two pixel light-transmitting regions that are adjacent to each other; and the orthographic projection of the third blocking structure on the base substrate covers the orthographic projection of the fourth blocking structure on the base substrate.

17. The display panel according to claim 16, further comprising: an array substrate and an opposing substrate opposite to each other;

the array substrate comprises: the base substrate, a first light-shielding metal layer on a side of the base substrate, a second light-shielding metal layer on a side away from the base substrate, of the first light-shielding metal layer; and the opposing substrate comprises: a black matrix.

18. The display panel according to claim 17, wherein at least one of the first blocking structure, the second blocking structure, the third blocking structure, the fourth blocking structure, or the fifth blocking structure is in the same one layer with the first light-shielding metal layer, the second light-shielding metal layer, or the black matrix.

19. The display panel according to claim 17, wherein the third blocking structure is in the array substrate;

wherein the display panel further comprises: a color film layer; wherein the color film layer is in the opposing substrate, or, the color film layer is in the array substrate.

* * * * *